US010459272B2

(12) United States Patent
Song et al.

(10) Patent No.: US 10,459,272 B2
(45) Date of Patent: Oct. 29, 2019

(54) LIQUID CRYSTAL DISPLAY INCLUDING BLOCKING FILM

(71) Applicant: Samsung Display Co., Ltd., Yongin, Gyeonggi-Do (KR)

(72) Inventors: Dae Ho Song, Hwaseong-si (KR); Seong Gyu Kwon, Suwon-si (KR); Yong Seok Kim, Seoul (KR); Jae Cheol Park, Hwaseong-si (KR); Seok-Joon Hong, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 453 days.

(21) Appl. No.: 14/724,604

(22) Filed: May 28, 2015

(65) Prior Publication Data

US 2016/0116794 A1    Apr. 28, 2016

(30) Foreign Application Priority Data

Oct. 22, 2014  (KR) .......................... 10-2014-0143453

(51) Int. Cl.
*G02F 1/1333* (2006.01)
*G02F 1/1335* (2006.01)
(Continued)

(52) U.S. Cl.
CPC ...... *G02F 1/133377* (2013.01); *G02F 1/1341* (2013.01); *G02F 1/133345* (2013.01); *G02F 1/133514* (2013.01); *H01L 27/1259* (2013.01); *G02F 1/1339* (2013.01); *G02F 1/133512* (2013.01); *G02F 1/133516* (2013.01); *G02F 2001/133388* (2013.01);

(Continued)

(58) Field of Classification Search
CPC ... G02F 1/133377; G02F 2001/133388; G02F 1/133345; G02F 1/133514; G02F 1/133512; G02F 1/1341
See application file for complete search history.

(56) References Cited

U.S. PATENT DOCUMENTS 6,992,737 B2 *  1/2006  Kaneko ............. G02F 1/133512
                                                    349/106
2013/0182203 A1 *  7/2013  Lee ................... G02F 1/133377
                                                    349/106
2014/0198283 A1    7/2014  Jin

FOREIGN PATENT DOCUMENTS

JP        H07-120728 A      5/1995
JP        2007-193153       8/2007
(Continued)

OTHER PUBLICATIONS

EP Search Report EP15187273 dated Jan. 29, 2016.

*Primary Examiner* — Paisley L Arendt
(74) *Attorney, Agent, or Firm* — Innovation Counsel LLP

(57) ABSTRACT

An exemplary embodiment provides a liquid crystal display including: a substrate configured to include a display area and a peripheral area; a thin film transistor disposed on the substrate; a pixel electrode connected to the thin film transistor; a roof layer disposed to face the pixel electrode; a capping layer disposed on the roof layer; and a blocking film disposed in the peripheral area to surround a lateral surface of the capping layer, wherein a plurality of microcavities are formed between the pixel electrode and the roof layer in the display area, and the microcavities form a liquid crystal layer including a liquid crystal material, wherein a level of a top surface of the blocking film is higher than that of a top surface of the liquid crystal layer.

16 Claims, 37 Drawing Sheets

(51) Int. Cl.
   *G02F 1/1341*  (2006.01)
   *H01L 27/12*  (2006.01)
   *G02F 1/1339*  (2006.01)
   *G02F 1/1362*  (2006.01)

(52) U.S. Cl.
   CPC ............ *G02F 2001/136222* (2013.01); *G02F 2201/501* (2013.01); *G02F 2201/52* (2013.01)

(56) References Cited

FOREIGN PATENT DOCUMENTS

| | | |
|---|---|---|
| JP | 2014-102500 A | 6/2014 |
| JP | 2014-142602 A | 8/2014 |
| KR | 1020040099733 A | 12/2004 |
| KR | 1020100004224 A | 1/2010 |
| KR | 1020120026880 A | 3/2012 |
| KR | 1020130015737 A | 2/2013 |
| KR | 10-2014-0025220 A | 3/2014 |
| KR | 1020140036911 A | 3/2014 |
| KR | 1020140058773 | 5/2014 |
| KR | 10-2014-0090851 A | 7/2014 |
| KR | 1020140112288 | 9/2014 |

\* cited by examiner

LIQUID CRYSTAL DISPLAY INCLUDING BLOCKING FILM

CROSS-REFERENCE TO RELATED APPLICATION

This application claims priority to and the benefit of Korean Patent Application No. 10-2014-0143453 filed in the Korean Intellectual Property Office on Oct. 22, 2014, the entire contents of which are incorporated herein by reference.

BACKGROUND (a) Field

The present application relates to a liquid crystal display and a manufacturing method thereof.

(b) Description of the Related Art

A liquid crystal display as one of flat panel display devices that are being widely used includes two display panels, wherein field generating electrodes such as a pixel electrode and a common electrode are formed with a liquid crystal layer interposed therebetween.

The liquid crystal display generates an electric field in a liquid crystal layer by applying a voltage to the field generating electrodes to determine orientations of liquid crystal molecules of the liquid crystal layer and control polarization of incident light, thereby displaying an image.

A technique of forming a cavity in a pixel and filling the cavity with liquid crystals to implement a display has been developed for one of the liquid crystal displays. Although two sheets of substrates are used in a conventional liquid crystal display, this technique forms constituent elements on one substrate, thereby reducing weight, thickness, and the like of the device.

A process of forming the display by filling the liquid crystal molecules in the microcavities includes a step of forming a capping layer after the liquid crystal molecules are injected. However, in the case of the capping layer currently employed, it is difficult to sufficiently block external oxygen and moisture, thereby generating a reliability problem.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a liquid crystal display and a manufacturing method thereof, having features of being capable of improving reliability by blocking external oxygen and moisture.

An exemplary embodiment provides a liquid crystal display including: a substrate configured to include a display area and a peripheral area; a thin film transistor disposed on the substrate; a pixel electrode connected to the thin film transistor; a roof layer disposed to face the pixel electrode; a capping layer disposed on the roof layer; and a blocking film disposed in the peripheral area to surround a lateral surface of the capping layer, wherein a plurality of microcavities are formed between the pixel electrode and the roof layer in the display area, and the microcavities form a liquid crystal layer including a liquid crystal material, wherein a level of a top surface of the blocking film is higher than that of a top surface of the liquid crystal layer.

The liquid crystal display may further include, in the display area: a lower insulating layer disposed below the roof layer; and an upper insulating layer disposed on the roof layer, wherein the lower insulating layer and the upper insulating layer may be made of an inorganic film, and the blocking film may include an organic/inorganic structure layer disposed to correspond to the lower insulating layer, the roof layer, and the upper insulating layer.

The organic/inorganic structure layer may include a first inorganic layer, an organic layer, and a second inorganic layer, the first inorganic layer may be disposed to correspond to the lower insulating layer, the second inorganic layer may be disposed to correspond to the upper insulating layer, and the organic layer includes at least one color filter.

The first inorganic layer may be connected to the lower insulating layer, and the second inorganic layer may be connected to the upper insulating layer.

The organic layer may have a structure at which color filters having different colors are stacked.

The roof layer may include a color filter.

The microcavities may be partitioned by a partition portion, and the partition portion may be formed by a color filter having a single color among the color filters.

The partition portion may be a part formed by filling a space between adjacent microcavities with the color filter having the single color.

The partition portion may be formed along a direction in which a data line connected to the thin film transistor is extended.

The second inorganic layer may be disposed to cover a top surface and a lateral surface of the organic layer.

The liquid crystal display may further include a barrier layer disposed on a top surface of the capping layer, and the barrier layer may include silicon nitride.

Top surfaces of the capping layer and the blocking film may be disposed at a same level.

The liquid crystal display may further include: a lower insulating layer disposed below the roof layer; and an upper insulating layer disposed on the roof layer, wherein the lower insulating layer and the upper insulating layer may be made of an inorganic film, the blocking film may be an organic/inorganic structure layer including the lower insulating layer extended from the display area, an organic layer, and the upper insulating layer extended from the display area, the organic layer may have a structure at which color filters having different colors may be stacked, and one of the color filters may be connected to the roof layer.

The liquid crystal display may further include a transparent electrode pattern disposed below the organic/inorganic structure layer.

The liquid crystal display may further include a sacrificial layer remaining pattern disposed below the organic/inorganic structure layer.

The blocking film and the roof layers disposed in the display area may be separated from each other.

An exemplary embodiment provides a manufacturing method of a liquid crystal display, including: forming a thin film transistor on a substrate including a display area and a peripheral area; forming a pixel electrode connected to the thin film transistor; forming a sacrificial layer on the pixel electrode; forming a roof layer on the sacrificial layer disposed in the display area; forming a blocking film disposed in the peripheral area; removing the sacrificial layer to form a plurality of microcavities; forming a liquid crystal layer by injecting a liquid crystal material into the microcavities; and forming a capping layer on the roof layer, wherein the forming of the roof layer and the forming of the blocking film are simultaneously performed.

The forming of the roof layer may include: forming a first color filter on the sacrificial layer; forming a second color filter on the sacrificial layer; and forming a third color filter on the sacrificial layer, and the forming of the blocking film may include stacking the first color filter, the second color filter, and the third color filter in the peripheral area.

The manufacturing method may further include: forming a lower insulating layer disposed below the roof layer; and forming an upper insulating layer disposed on the roof layer, wherein the lower insulating layer and the upper insulating layer may be made of an inorganic film, and the lower insulating layer and the upper insulating layer formed in the display area may extend to form the blocking film together with a color filter disposed in the peripheral area.

The forming of the sacrificial layer may include forming an open portion disposed according to a data line connected to the thin film transistor, and the open portion may be filled with one of the first color filter, the second color filter, and the third color filter.

The color filter that fills the open portion may form a partition portion, and the partition portion may partition the microcavities.

The blocking film may be formed to have a top surface of which a level is higher than that of a top surface of the liquid crystal layer.

The color filter disposed in the peripheral area may be connected to one of the first color filter, the second color filter, and the third color filter.

The manufacturing method may further include forming a transparent electrode pattern disposed below the blocking film.

The forming of the sacrificial layer may further include forming a sacrificial layer remaining pattern in the peripheral area.

The manufacturing method may further include forming a barrier layer on a top surface of the capping layer, and the barrier layer may include silicon nitride.

Top surfaces of the capping layer and the blocking film may be disposed at a same level.

The forming of the roof layer may include forming the roof layer separated from the blocking film.

According to the exemplary embodiments, it is possible to block moisture and oxygen from penetrating into an edge of a display area by forming a blocking film at a peripheral area to improve the reliability of elements. Further, since the blocking film is formed in the same process when an organic film and an inorganic film are formed at the display area, no additional mask is required.

DETAILED DESCRIPTION OF THE EMBODIMENTS

Figure 1:
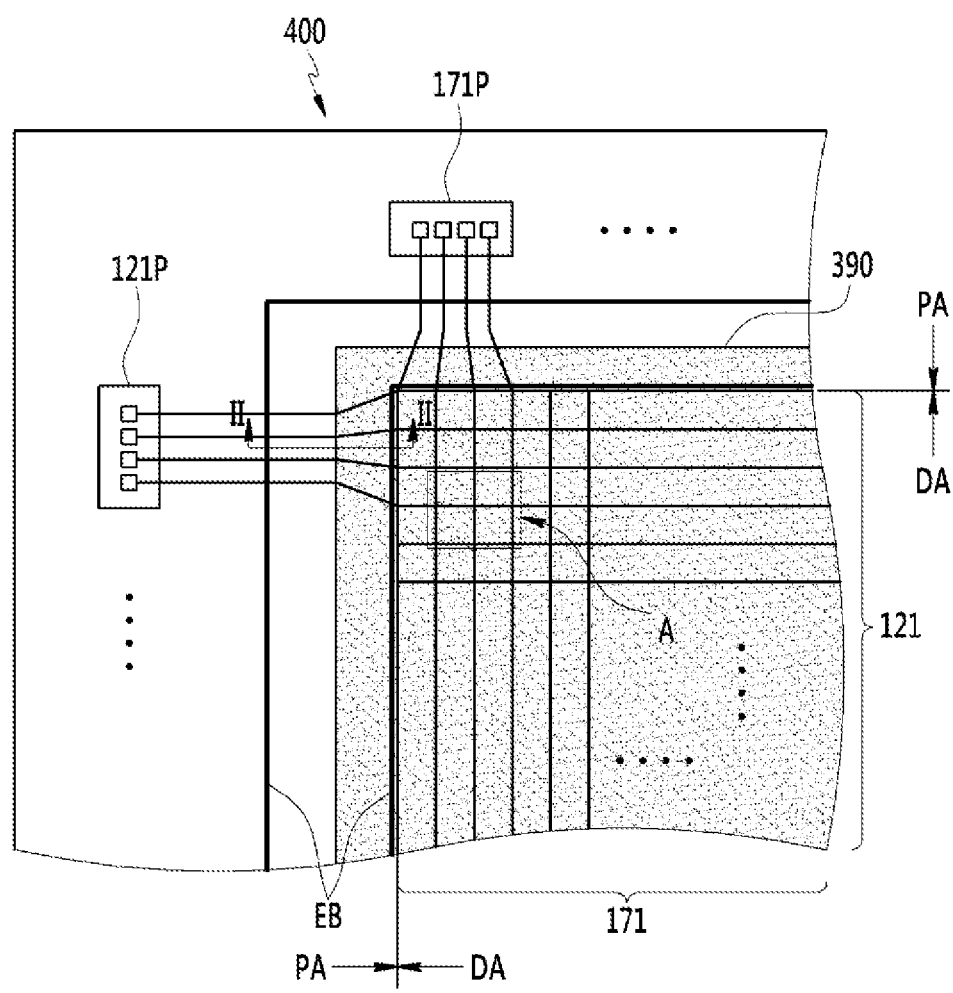
FIG. 1 is a top plan view partially illustrating a peripheral area and a display area in a liquid crystal display according to an exemplary embodiment.

Hereinafter, exemplary embodiments will be described in detail with reference to the accompanying drawings. As those skilled in the art would realize, the described embodiments may be modified in various different ways, all without departing from the spirit or scope of the inventive concept. On the contrary, exemplary embodiments introduced herein are provided to make disclosed contents thorough and complete and to sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening elements may also be present. Like reference numerals designate like elements throughout the specification.

Figure 2:
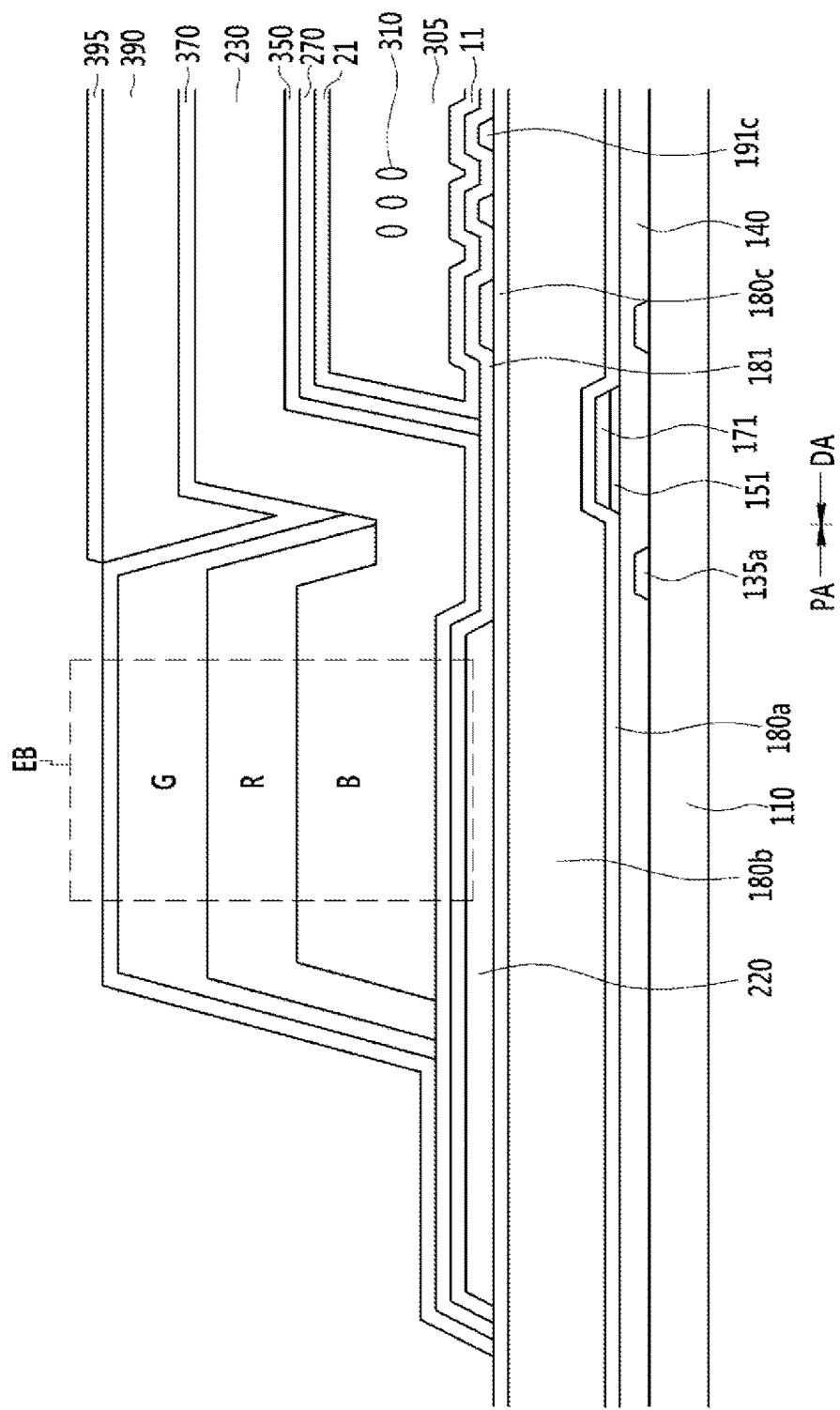
FIG. 2 is a cross-sectional view taken along the line II-II of FIG. 1.

FIG. 1 is a top plan view partially illustrating a peripheral area PA and a display area DA in a liquid crystal display according to an exemplary embodiment. FIG. 2 is a cross-sectional view taken along the line II-II of FIG. 1.

Referring to FIG. 1 and FIG. 2, the liquid crystal display according to the present exemplary embodiment may include a liquid crystal panel assembly 400, a gate driver (not shown) and a data driver (not shown) connected thereto, a gray voltage generator (not shown) connected to the data driver, a light source unit (not shown) emitting light to the liquid crystal panel assembly 400, a light source driver (not shown) controlling the light source unit, and a signal controller (not shown) controlling them.

The gate driver or the data driver may be formed on the liquid crystal panel assembly 400, and may be formed as a separate integrated circuit chip.

A substrate 110 of the liquid crystal panel assembly 400 includes the display area DA and the peripheral area PA positioned to surround the display area DA. The display region DA is a region where an actual image is outputted, and in the peripheral region PA, the aforementioned gate driver or data driver is formed, or a gate pad portion 121P, a data pad portion 171P including a gate pad, a data pad, or the like, which is a portion connected to an external circuit, is positioned. The gate pad is a wide portion positioned at an end of a gate line 121, and the data pad is a wide portion positioned at an end of a data line 171.

The liquid crystal display according to the present exemplary embodiment includes a first inorganic layer 350, sometimes called a lower insulating layer 350, an organic film in which color filters R, G, and B are stacked in the peripheral area PA, and a blocking film EB including a second inorganic layer 370, sometimes called an upper insulating layer 370. The first inorganic layer 350 indicates an inorganic film that is disposed in the display area DA and is extended to be positioned in the peripheral area PA. The second inorganic layer 370 indicates an inorganic film that is disposed in the display area DA and is extended to be positioned in the peripheral area PA. When color filters having different color filters are stacked in an organic film, the stacking sequence of the color filters may be varied.

In the present exemplary embodiment, the blocking film EB having both organic films and inorganic films is described. However, the inventive concept is not limited thereto. For example, at least one of the inorganic films may be omitted. The lower insulating layer 350 and the upper insulating layer 370 of the inorganic films included in the blocking film EB may include silicon nitride (SiNx).

The inorganic film included in the blocking film EB may further include a third interlayer insulating layer 180c disposed below the lower insulating layer 350 disposed in the peripheral area PA.

In the present exemplary embodiment, a roof layer 230 formed as a color filter is disposed on a microcavity 305 serving as a space corresponding to the liquid crystal layer including liquid crystal molecules 310, and a capping layer 390 is disposed on the roof layer 230. In the present exemplary embodiment, a level of a top surface of the blocking film EB may be higher than that of the liquid crystal layer including liquid crystal molecules 310, and the blocking film EB has such a structure so as to surround a lateral surface of the capping layer 390. Accordingly, in the liquid crystal display according to the present exemplary embodiment, as an outer circumferential portion of the display area DA is surrounded by the blocking film EB, moisture and oxygen can be prevented from penetrating into a lateral surface of the display area DA. As a result, it is possible to prevent reliability reduction of elements of the liquid crystal display.

The roof layer 230 is formed at a portion corresponding to the microcavity 305 to include one color filter. However, the blocking film EB may include one or more color filters.

Hereinafter, constituent elements disposed in the display area DA of the liquid crystal display will be described in detail with reference to FIG. 3 to FIG. 5.

Figure 3:
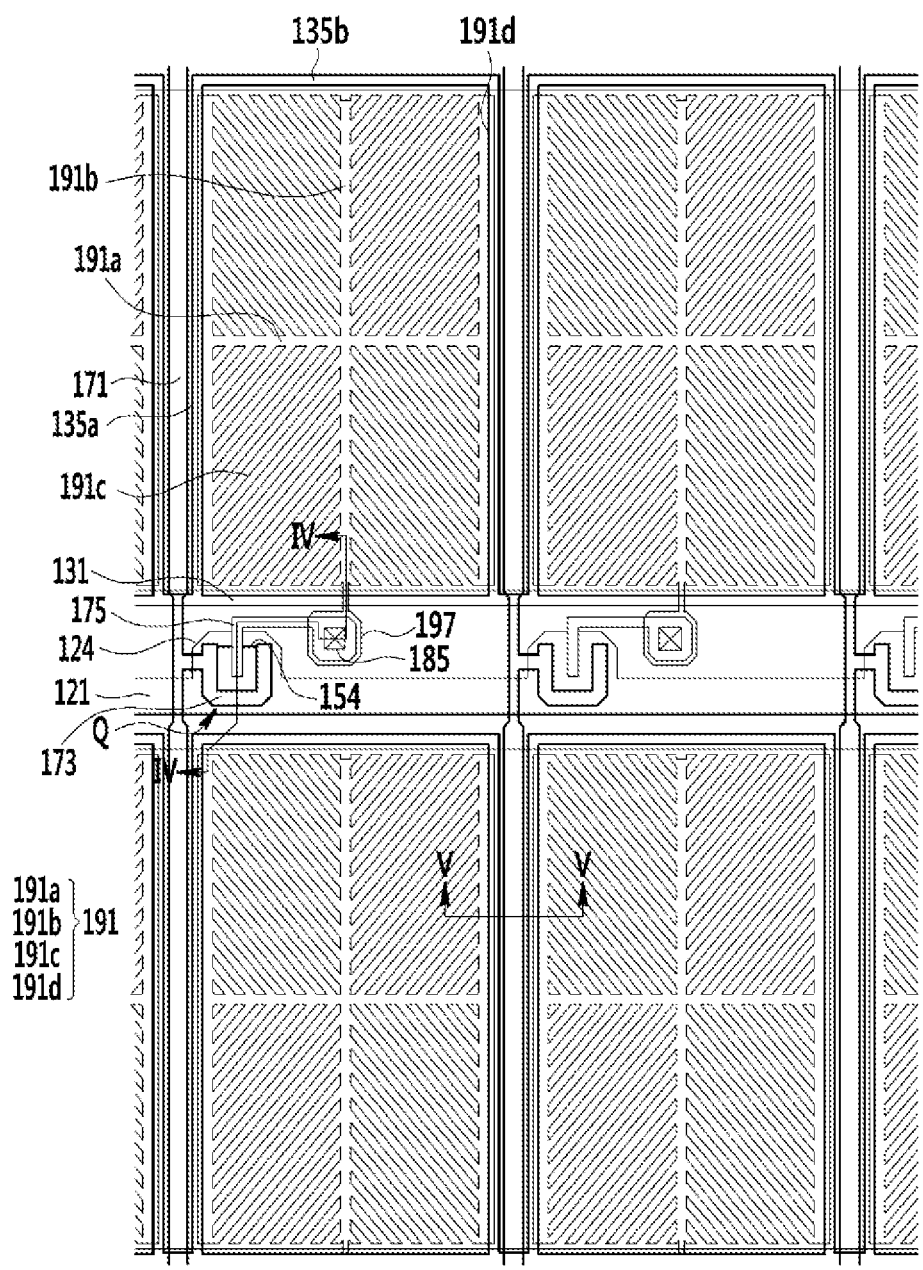
FIG. 3 is a top plan view illustrating a region A illustrated in FIG. 1.

FIG. 3 is a top plan view illustrating a region A illustrated in FIG. 1. FIG. 4 is a cross-sectional view taken along the line IV-IV of FIG. 3. FIG. 5 is a cross-sectional view taken along the line V-V of FIG. 3.

FIG. 3 shows a 2×2 pixel portion as a center portion of a plurality of pixels, and these pixels may be repeatedly arranged up/down and right/left in the liquid crystal display according to an exemplary embodiment.

Figure 4:
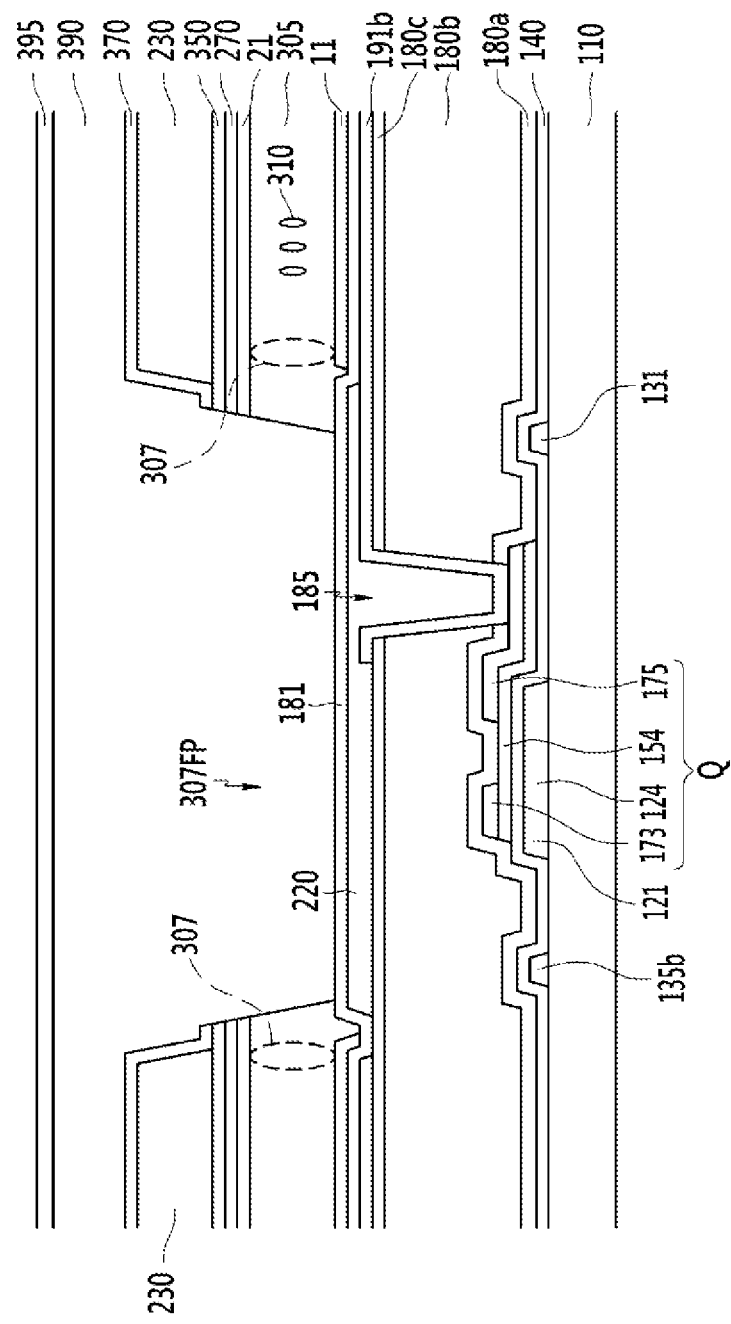
FIG. 4 is a cross-sectional view taken along the line IV-IV of FIG. 3.
Figure 5:
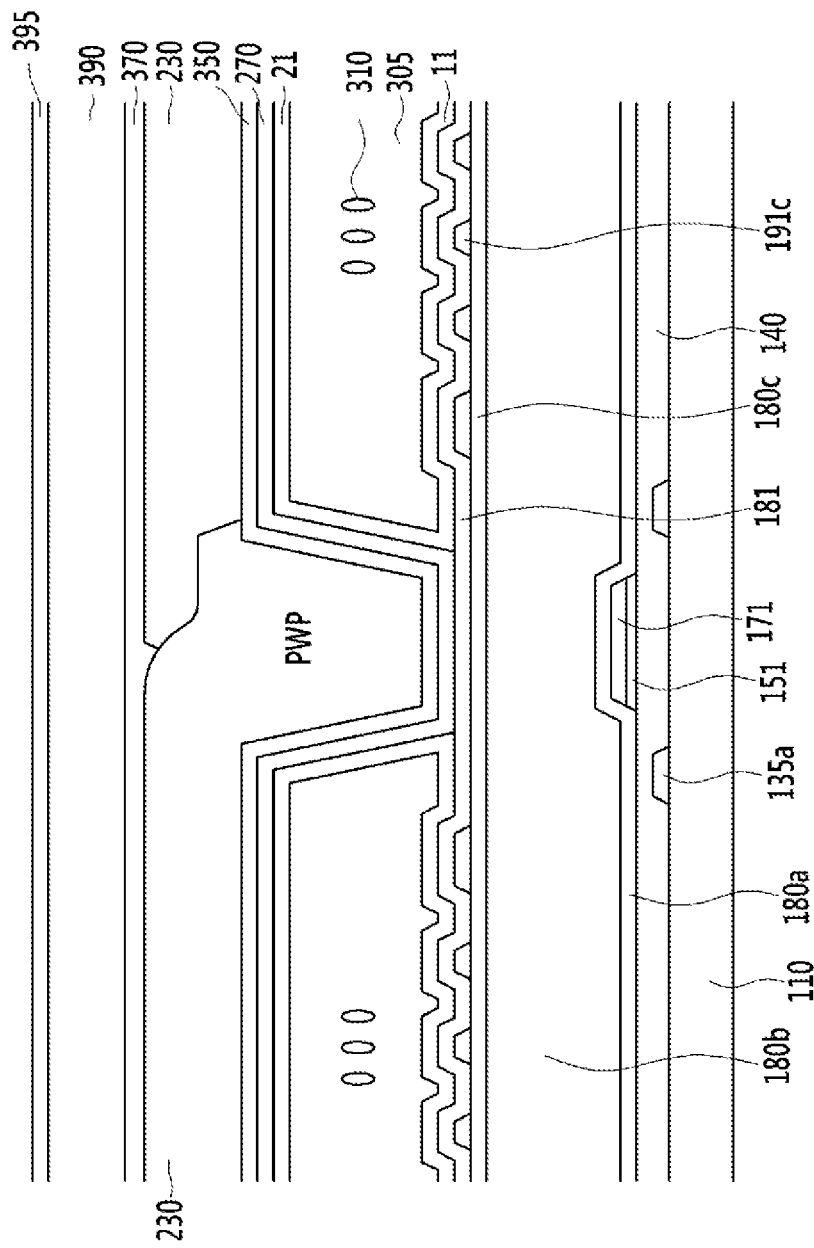
FIG. 5 is a cross-sectional view taken along the line V-V of FIG. 3.

Referring to FIG. 3 to FIG. 5, a gate line 121 and a storage electrode line 131 are formed on a substrate 110 made of transparent glass or plastic. The gate line 121 includes a gate electrode 124. The storage electrode line 131 is mainly extended in a horizontal direction, and transfers a predetermined voltage such as a common voltage Vcom. The storage electrode line 131 includes a pair of vertical storage electrode portions 135a substantially extended to be perpendicular to the gate line 121, and a horizontal storage electrode portion 135b connecting ends of the pair of vertical storage electrode portions 135a to each other. The vertical and horizontal storage electrode portions 135a and 135b have a structure surrounding a pixel electrode 191.

A gate insulating layer 140 is formed on the gate line 121 and the storage electrode line 131. A semiconductor layer 151 positioned under a data line 171 and a semiconductor layer 154 positioned under source/drain electrodes 173/175 and corresponding to a channel region of a thin film transistor Q are formed on the gate insulating layer 140.

A plurality of ohmic contacts may be formed between the semiconductor layer 151 and the data line 171, and between the semiconductor layer 154 under the source/drain electrodes 173/175 and corresponding to the channel region and the source/drain electrodes 173/175, and are omitted in the drawings.

Data conductors 171, 173, and 175 including the source electrode 173, the data line 171 connected to the source electrode 173, and the drain electrode 175 are formed on the semiconductor layers 151 and 154 and the gate insulating layer 140.

The gate electrode 124, the source electrode 173, and the drain electrode 175 form the thin film transistor Q along with the semiconductor layer 154, and the channel of the thin film transistor Q is formed in the exposed portion of the semiconductor layer between the source electrode 173 and the drain electrode 175.

A first interlayer insulating layer 180a is formed on the data conductors 171, 173, and 175 and the exposed semiconductor layer 154. The first interlayer insulating layer 180a may include an inorganic insulator such as silicon nitride (SiNx) and silicon oxide (SiOx).

A second interlayer insulating layer 180b and the third interlayer insulating layer 180c may be positioned on the first interlayer insulating layer 180a. The second interlayer insulating layer 180b may be formed of the organic material, and the third interlayer insulating layer 180c may include the inorganic insulator such as the silicon nitride (SiNx) and silicon oxide (SiOx). The second interlayer insulating layer 180b is formed of the organic material thereby reducing or removing a step. Differently from the present exemplary embodiment, one or two of the first interlayer insulating layer 180a, the second interlayer insulating layer 180b, and the third interlayer insulating layer 180c may be omitted.

A contact hole 185 passing through the first interlayer insulating layer 180a, the second interlayer insulating layer 180b, and the third interlayer insulating layer 180c may be formed. The pixel electrode 191 positioned on the third interlayer insulating layer 180c may be electrically and physically connected to the drain electrode 175 through the contact hole 185. Hereafter, the pixel electrode 191 will be described in detail.

The pixel electrode 191 may be made of a transparent conductive material such as ITO or IZO.

An overall shape of the pixel electrode 191 is a quadrangle, and the pixel electrode 191 includes cross stems configured by a horizontal stem 191a and a vertical stem 191b crossing the horizontal stem 191a. Further, the pixel electrode 191 is divided into four sub-regions by the horizontal stem 191a and the vertical stem 191b, and each sub-region includes a plurality of minute branches 191c. In the present exemplary embodiment, the pixel electrode 191 may further include an outer stem 191d connecting the minute branches 191c at right and left edges of the pixel electrode 191. In the present exemplary embodiment, the outer stem 191d is positioned at the right and left edges of the pixel electrode 191, however it may be positioned to extend to an upper portion or a lower portion of the pixel electrode 191.

The minute branches 191c of the pixel electrode 191 form an angle of approximately 40° to 45° with the gate line 121 or the horizontal stem 191a. Further, the minute branches of two adjacent sub-regions may be perpendicular to each other. In addition, a width of each minute branch may be gradually increased, or a distance between the minute branches 191c may be varied.

The pixel electrode 191 includes an extension 197 which is connected at a lower end of the vertical stem 191b, has a larger area than the vertical stem 191b, and is electrically and physically connected to the drain electrode 175 through the contact hole 185 at the extension 197, thereby receiving the data voltage from the drain electrode 175.

The thin film transistor Q and the pixel electrode 191 described above are just examples, and a structure of the thin film transistor and a design of the pixel electrode may be modified in order to improve side visibility.

A light blocking member 220 is disposed on the pixel electrode 191 to cover a region where the thin film transistor Q is formed. The light blocking member 220 according to the present exemplary embodiment may be formed along a direction in which the gate line 121 extends. The light blocking member 220 may be formed of a material that blocks light.

An insulating layer 181 may be formed on the light blocking member 220, and the insulating layer 181 covering the light blocking member 220 may extend on the pixel electrode 191. The insulating layer 181 may be formed of silicon nitride (SiNx) or silicon oxide (SiOx).

A lower alignment layer 11 is formed on the pixel electrode 191, and may be a vertical alignment layer. The lower alignment layer 11, as a liquid crystal alignment layer made of a material such as polyamic acid, a polysiloxane, a polyimide, or the like, may include at least one of generally used materials. Further, the lower alignment layer 11 may be a photoalignment layer.

An upper alignment layer 21 is disposed at a portion facing the lower alignment layer 11, and the microcavity 305 is formed between the lower alignment layer 11 and the upper alignment layer 21. A liquid crystal material including liquid crystal molecules 310 is injected into the microcavity 305, and the microcavity 305 has an entrance region 307. The microcavities 305 may be formed along a column direction of the pixel electrode 191, that is, in the vertical direction. In the present exemplary embodiment, the alignment material forming the alignment layers 11 and 21 and the liquid crystal material including the liquid crystal molecules 310 may be injected into the microcavity 305 by using capillary force. In the present exemplary embodiment, the lower alignment layer 11 and the upper alignment layer 21 are merely distinguished according to position, and may be connected to each other as shown as in FIG. 5. The lower alignment layer 11 and the upper alignment layer 21 may be simultaneously formed.

The microcavity 305 is divided in the vertical direction by a plurality of liquid crystal injection portions 307FP positioned at a portion overlapping the gate line 121, thereby forming the plurality of microcavities 305, and the plurality of microcavities 305 may be formed along a column direction of the pixel electrode 191, that is, in the vertical direction. Further, the microcavity 305 is divided in the horizontal direction by a partition portion PWP that will be described later, thereby forming the plurality of microcavities 305, and the microcavities 305 may be formed along the row direction of the pixel electrode 191, that is, the horizontal direction in which the gate line 121 extends. The formed microcavities 305 may respectively correspond to one or more pixel areas, and the pixel areas may correspond to a region displaying the image.

A common electrode 270 and the lower insulating layer 350 are positioned on the upper alignment layer 21. The common electrode 270 receives the common voltage, and generates an electric field together with the pixel electrode 191 to which the data voltage is applied to determine a direction in which the liquid crystal molecules 310 positioned at the microcavity 305 between the two electrodes 270, 191 are inclined. The common electrode 270 forms a capacitor with the pixel electrode 191 to maintain the received voltage even after the thin film transistor Q is turned off.

The lower insulating layer 350 may be formed of silicon nitride (SiNx) or silicon oxide (SiOx). Referring to FIG. 2 and FIG. 4, the lower insulating layer 350 may be disposed in both the display area DA and the peripheral area PA.

In the present exemplary embodiment, it is described that the common electrode 270 is formed on the microcavity 305, but in another exemplary embodiment, the common electrode 270 is formed under the microcavity 305, so that liquid crystal driving according to a coplanar electrode (CE) mode is possible.

In the present exemplary embodiment, the color filter 230, also called a roof layer 230, is disposed on the lower insulating layer 350. As shown in FIG. 5, among the color filters neighboring each other, the color filter 230 of one color forms the partition portion PWP. The partition portion PWP is disposed between the microcavities 305 neighboring in the horizontal direction. The partition portion PWP is a portion filling the separation space of the microcavities 305 neighboring in the horizontal direction. As shown in FIG. 5, the partition portion PWP completely fills the separation space of the microcavity 305, however it is not limited thereto, and it may partially fill the separation space. The partition portion PWP may be formed along the direction that the data line 171 extends.

The color filters 230 neighboring each other on the partition portion PWP may overlap. The boundary surface where the neighboring color filters 230 meet each other may be positioned at the portion corresponding to the partition portion PWP.

In the present exemplary embodiment, the color filter 230 and the partition portion PWP function as a roof layer supporting the microcavity 305 to maintain the shape thereof.

Hereafter, the color filter 230 according to an exemplary embodiment will be described with reference to FIG. 6 and FIG. 7.

Figure 6:
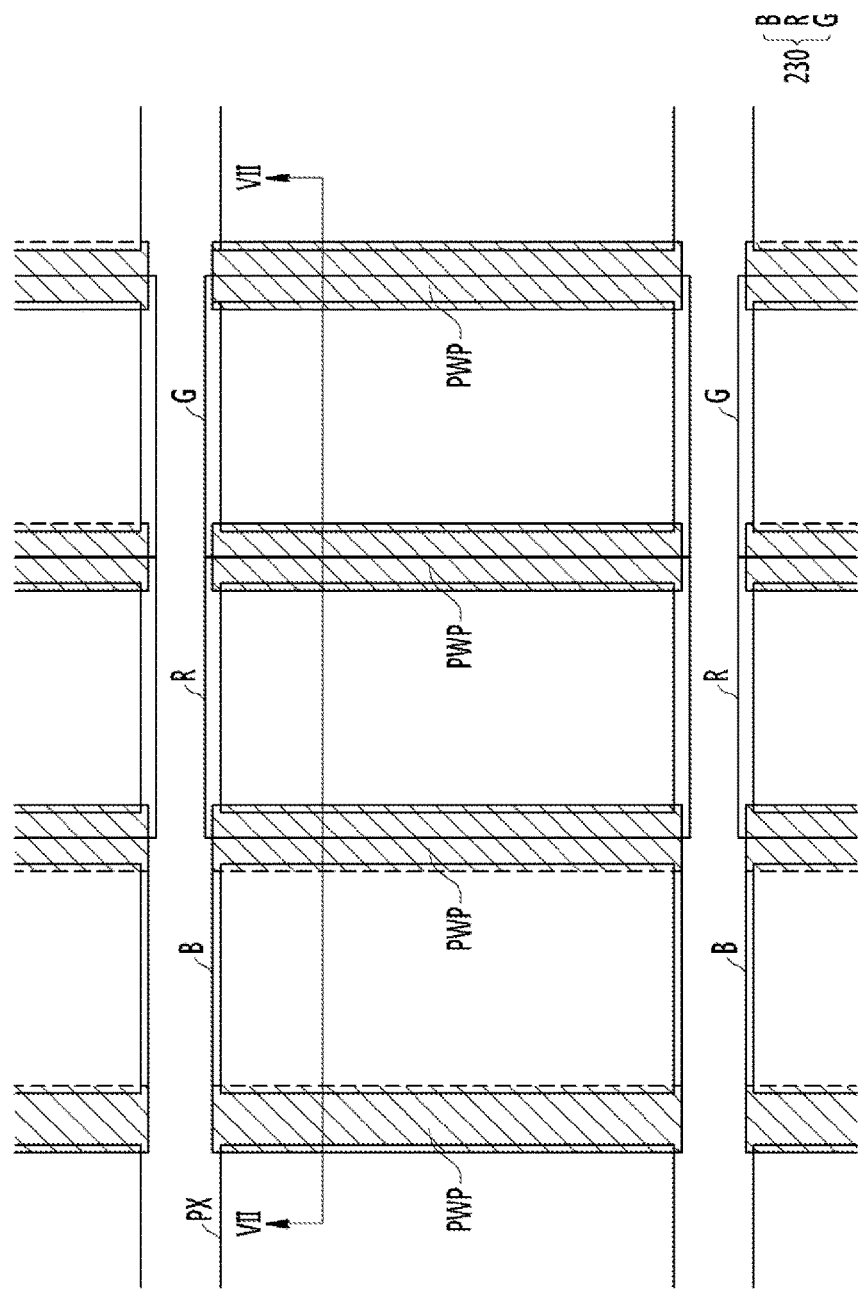
FIG. 6 is a top plan view of a color filter and a partition portion in a liquid crystal display according to an exemplary embodiment.

FIG. 6 is a top plan view of a color filter 230 and a partition portion PWP in a liquid crystal display according to an exemplary embodiment. FIG. 7 is a cross-sectional view taken along the line VII-VII of FIG. 6.

Figure 7:
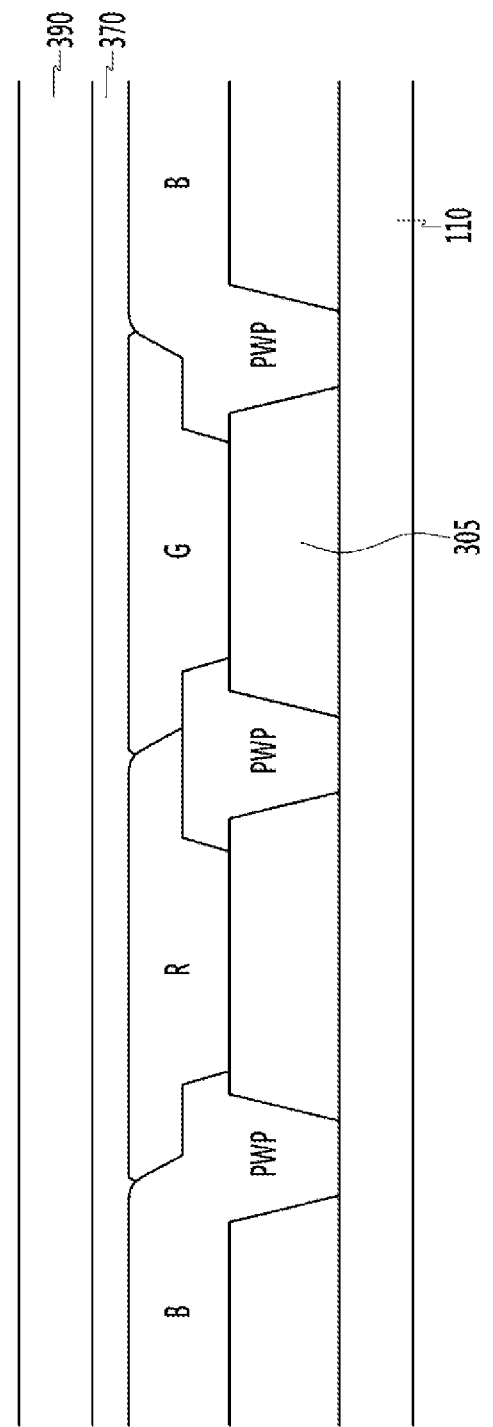
FIG. 7 is a cross-sectional view taken along the line VII-VII of FIG. 6.

FIG. 6 and FIG. 7 are views to schematically explain the color filter 230 and the partition portion PWP in the liquid crystal display according to an exemplary embodiment, and the constituent elements between the substrate 110 and the microcavity 305 may be applied with the description in FIG. 3 to FIG. 5 as it is.

Referring to FIG. 6 and FIG. 7, the color filter 230 according to the present exemplary embodiment includes a first color filter, a second color filter, and a third color filter, and the first color filter may include a blue color filter B, the second color filter may include a red color filter R, and the third color filter may include a green color filter G.

According to the present exemplary embodiment, the partition portion PWP is formed by any one among the first color filter, the second color filter, and the third color filter. In an exemplary embodiment, the first color filter corresponding to the blue color filter B forms the partition portion PWP. The blue color filter B may include the partition portion PWP extended from the portion corresponding to the pixel area PX and the partition portion PWP positioned between the red color filter R and the green color filter G. In this case, the red color filter R and the green color filter G covering edges opposite to each other in the partition portions PWP are simultaneously adjacent to each other, and may overlap on the partition portion PWP.

Instead of the blue color filter B, it is possible to form the partition portion PWP made of the red color filter R or the green color filter G. However, the blue color filter B has a larger blocking effect compared with the red color filter R or the green color filter G, and thus there is a merit of reducing reflection of the light if the partition portion PWP is formed of the blue color filter B. In addition, the blue color filter B has excellent fluidity of a photoresist of the color filter as well as the light blocking effect, thereby obtaining a good taper angle. Accordingly, compared with a case that an end shape of the color filter forming the partition portion PWP is undercut is vertical, the end of the color filter is slanted with an angle of more than about 45 degrees, so the color filter coated on the partition portion PWP while covering the side wall of the partition portion PWP may be well formed.

As shown in FIG. 6, the color filter 230 may be formed to have an island shape to correspond to the pixel area PX.

The inventive concept is not limited to the aforementioned exemplary embodiment. For example, color filters 230 which are adjacent to each partition portion PWP may form the partition portions PWP.

Referring to FIG. 2 and FIG. 7, each of the blue color filter B, the red color filter R, and the green color filter G may serve to support the microcavity 305 by forming the roof layer in the display area DA, and may serve as the blocking film EB by forming a structure at which the color filters B, R, and G are stacked in the peripheral area PA.

Again referring to FIG. 4 and FIG. 5, the upper insulating layer 370 is disposed on the color filter 230. The upper insulating layer 370 may be formed of the silicon nitride (SiNx) or the silicon oxide (SiOx). As shown in FIG. 4, the side surface of the color filter 230 may be covered. Referring to FIG. 2 and FIG. 4, the upper insulating layer 370 may be disposed in both the display area DA and the peripheral area PA.

The capping layer 390 is positioned on the upper insulating layer 370. The capping layer 390 is also positioned at the liquid crystal injection portion 307FP and the entrance region 307 of the microcavity 305 exposed by the liquid crystal injection portion 307FP. The capping layer 390 includes the organic material or the inorganic material. Herein, the liquid crystal material is removed in the liquid crystal injection portion 307FP, but the liquid crystal material that remains after being injected to the microcavity 305 may remain at the liquid crystal injection portion 307FP. Referring to FIG. 2 and FIG. 5, top surfaces of the capping layer 390 and the blocking film EB may be disposed at substantially the same height/level.

A barrier layer 395 may be formed on the capping layer 390. The barrier layer 395 may include silicon nitride (SiNx) and the like to serve to additionally prevent penetration of external moisture and oxygen.

In the present exemplary embodiment, as shown in FIG. 5, the partition portions PWP are formed by the color filters 230 having a single color disposed between the microcavities 305 that are adjacent to each other in a horizontal direction. The partition portions PWP can partition or define the microcavities 305 by forming partition walls. In the present exemplary embodiment, a partition structure such as the partition portions PWP is disposed between the microcavities 305. Accordingly, even though the substrate 110 is bent, less stress may be generated and a degree at which the cell gap is deformed may be reduced.

Figure 8:
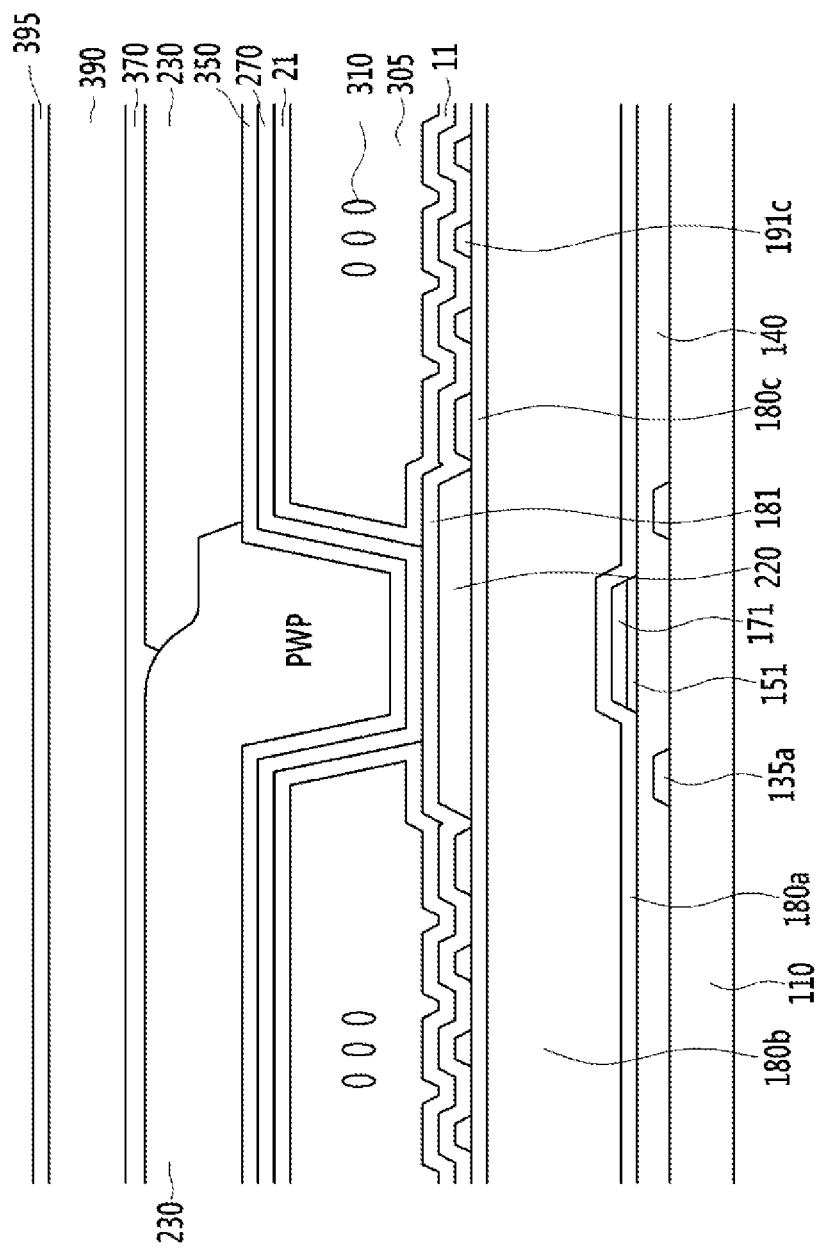
FIG. 8 is a cross-sectional view of a variation exemplary embodiment of the exemplary embodiment of FIG. 5.

FIG. 8 is a cross-sectional view of a variation exemplary embodiment of the exemplary embodiment of FIG. 5.

Referring to FIG. 8, the present exemplary embodiment is the same as most of the exemplary embodiment described in FIG. 5. However, the light blocking member 220 is formed along the direction that the data line 171 extends. The light blocking member 220 is positioned on the third interlayer insulating layer 180c or the pixel electrode 191. The light blocking member 220 that is described herein may be formed of a lattice shape where it is extended in the direction of the gate line 121.

Figure 9:
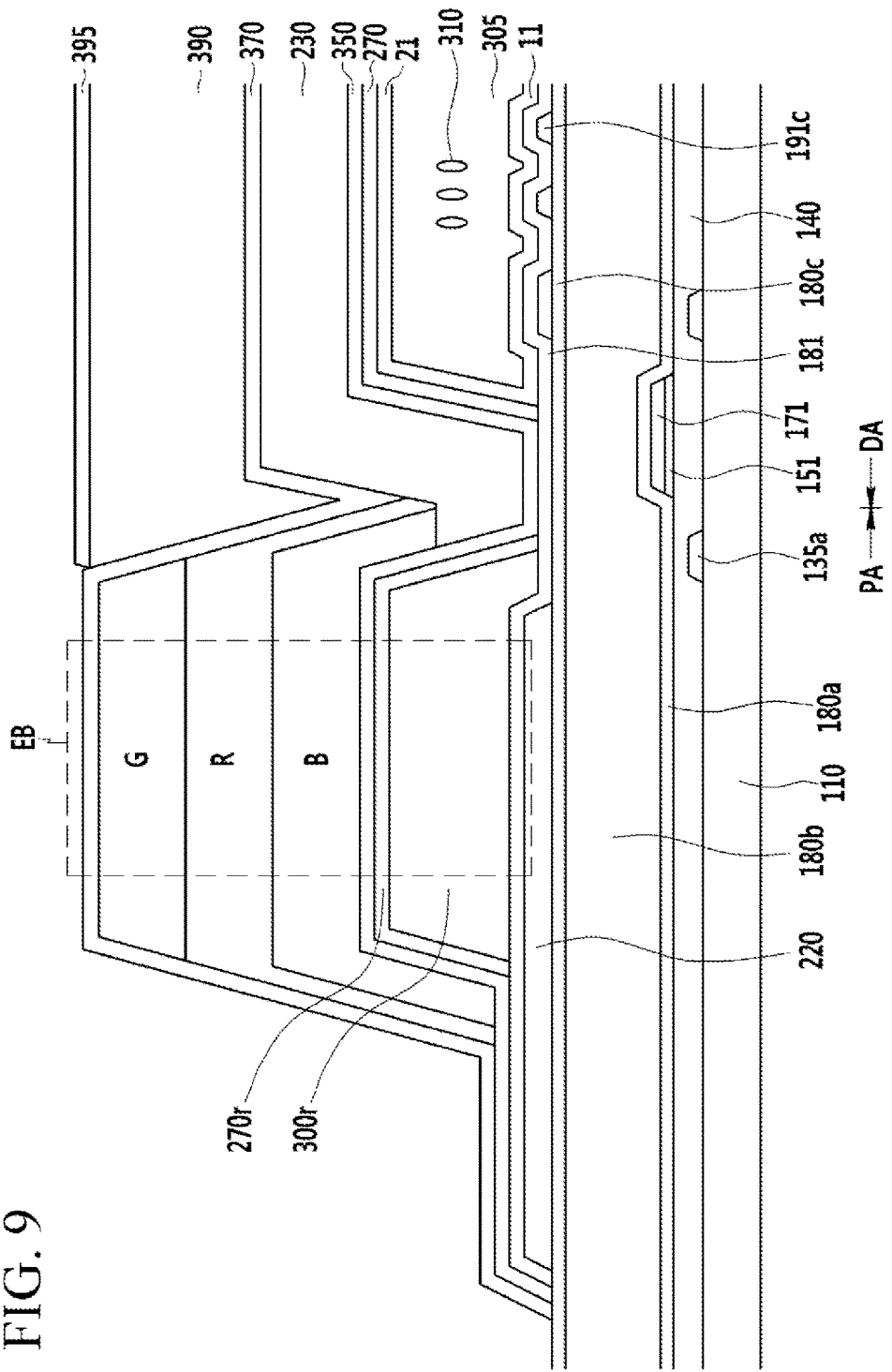
FIG. 9 is a cross-sectional view of a variation exemplary embodiment of the exemplary embodiment of FIG. 2.

FIG. 9 is a cross-sectional view of a variation exemplary embodiment of the exemplary embodiment of FIG. 2.

Referring to FIG. 9, this variation exemplary embodiment is mostly the same as the exemplary embodiment of FIG. 2. However, in this variation exemplary embodiment, a sacrificial layer remaining pattern 300r and a transparent electrode pattern 270r may be disposed at a portion of the peripheral area PA to corresponding to the blocking film EB. The sacrificial layer remaining pattern 300r and the transparent electrode pattern 270r are disposed between the insulating layer 181 and the lower insulating layer 350. The sacrificial layer remaining pattern 300r may be formed by remaining in the peripheral area PA when the sacrificial layer 300 is patterned in a manufacturing process of a liquid crystal display according to an exemplary embodiment of FIG. 13 which will be described later. The sacrificial layer remaining pattern 300r may be formed by employing a photoresist material or an organic material excluding it. The transparent electrode pattern 270r may be formed by employing the same material through the same process as those of the common electrode 270 disposed in the display area DA.

Figure 10:
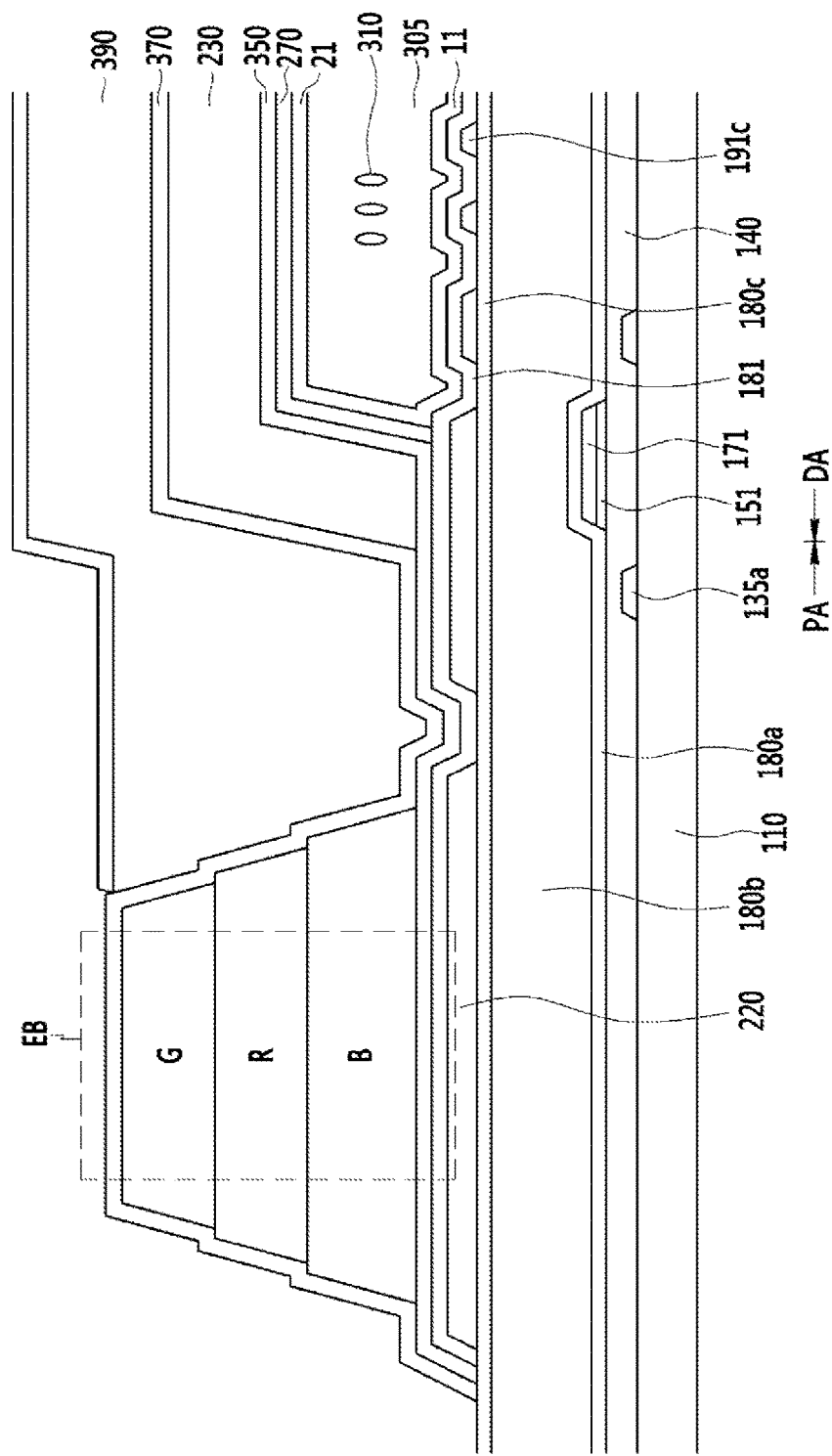
FIG. 10 is a cross-sectional view of a variation exemplary embodiment of the exemplary embodiment of FIG. 2.

FIG. 10 is a cross-sectional view of a variation exemplary embodiment of the exemplary embodiment of FIG. 2.

Referring to FIG. 10, this variation exemplary embodiment is mostly the same as the exemplary embodiment of FIG. 2. However, in this variation exemplary embodiment, the blocking film EB and the color filters 230 which form the roof layer are disposed to be separated from each other.

Next, an exemplary embodiment for a manufacturing method of the above described liquid crystal display will be described with reference to FIG. 11 to FIG. 37. An exemplary embodiment to be described below may be varied as an exemplary embodiment of the manufacturing method.

Figure 19:
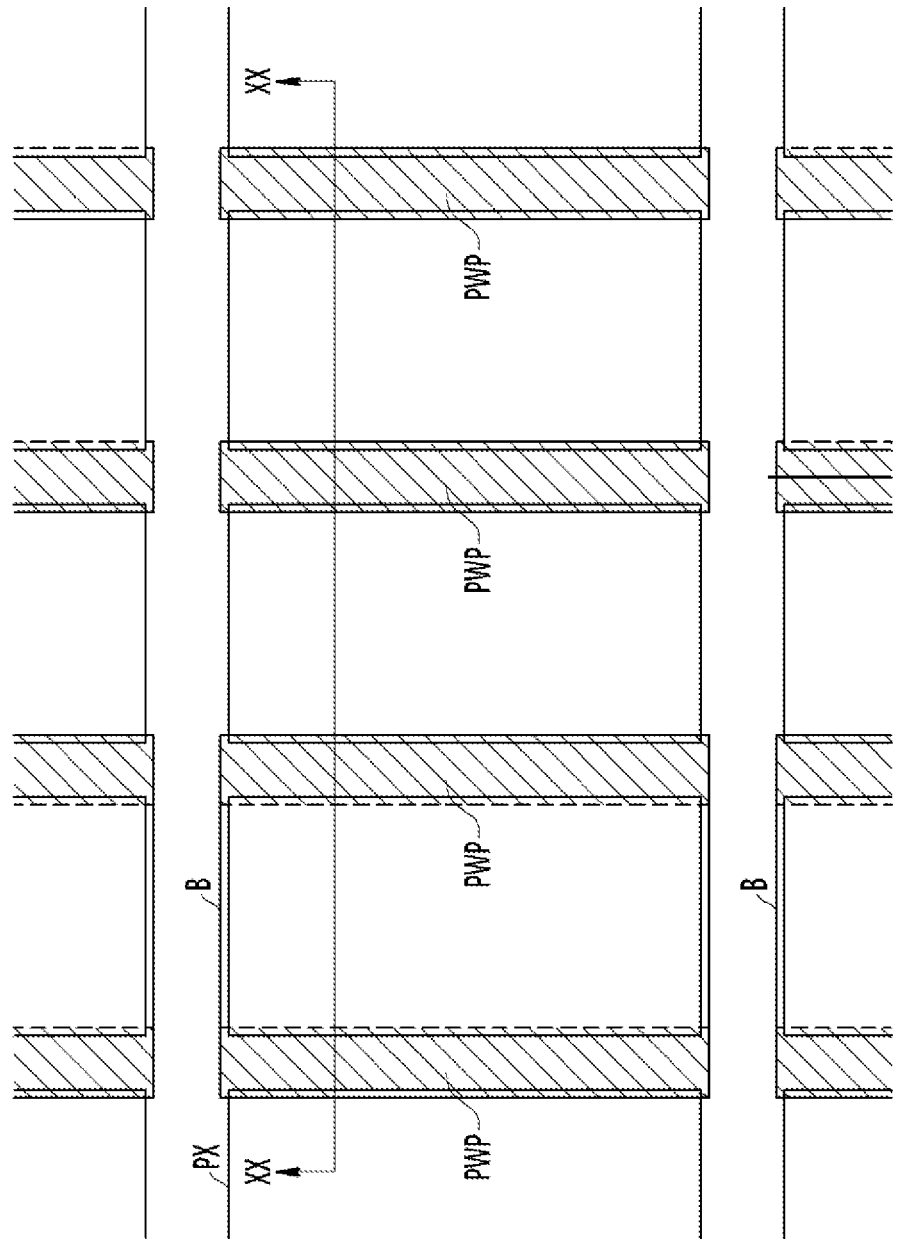
Figure 20:
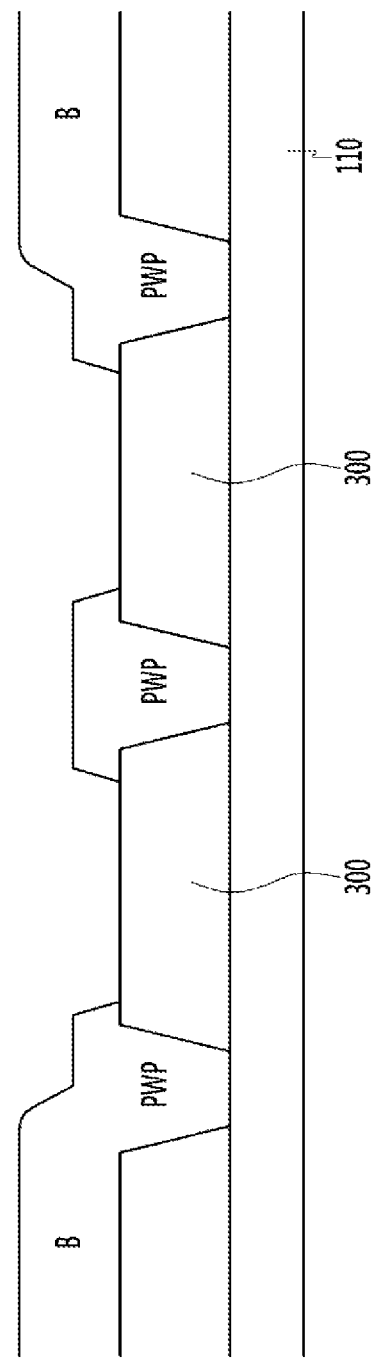
Figure 21:
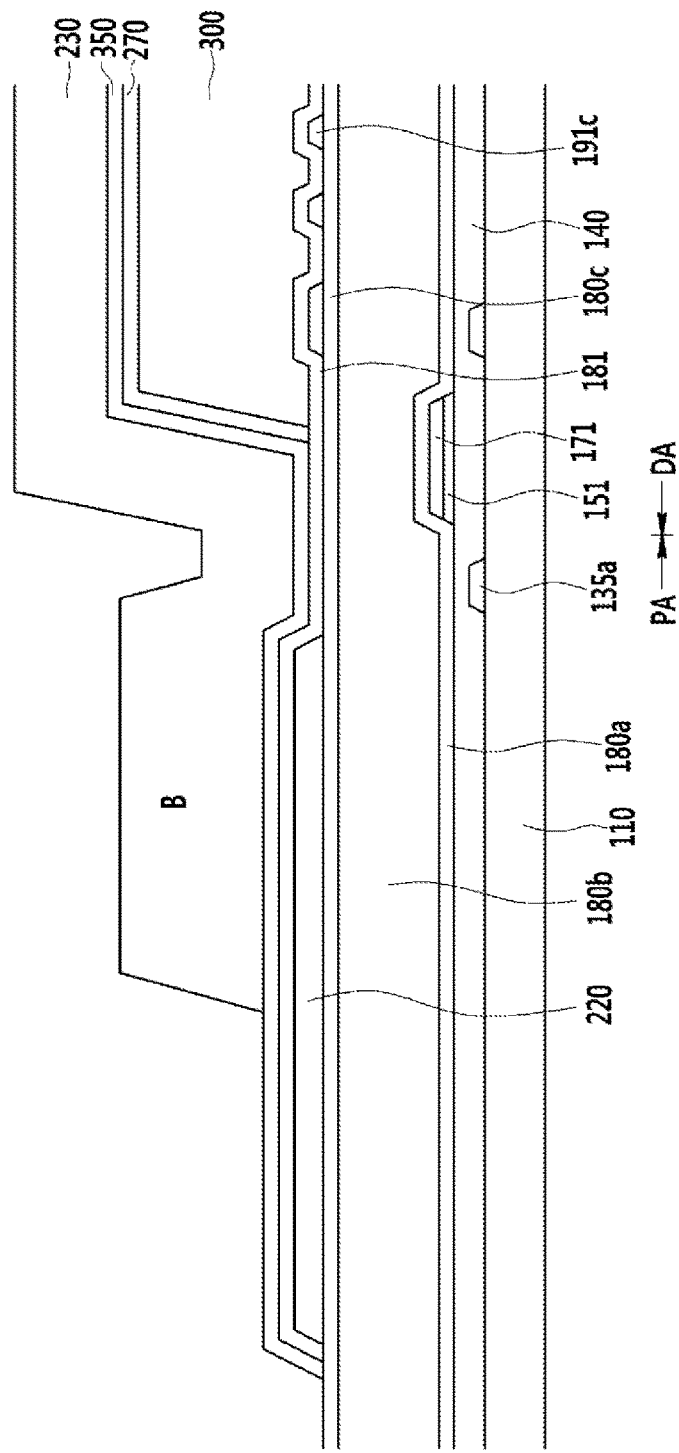
Figure 22:
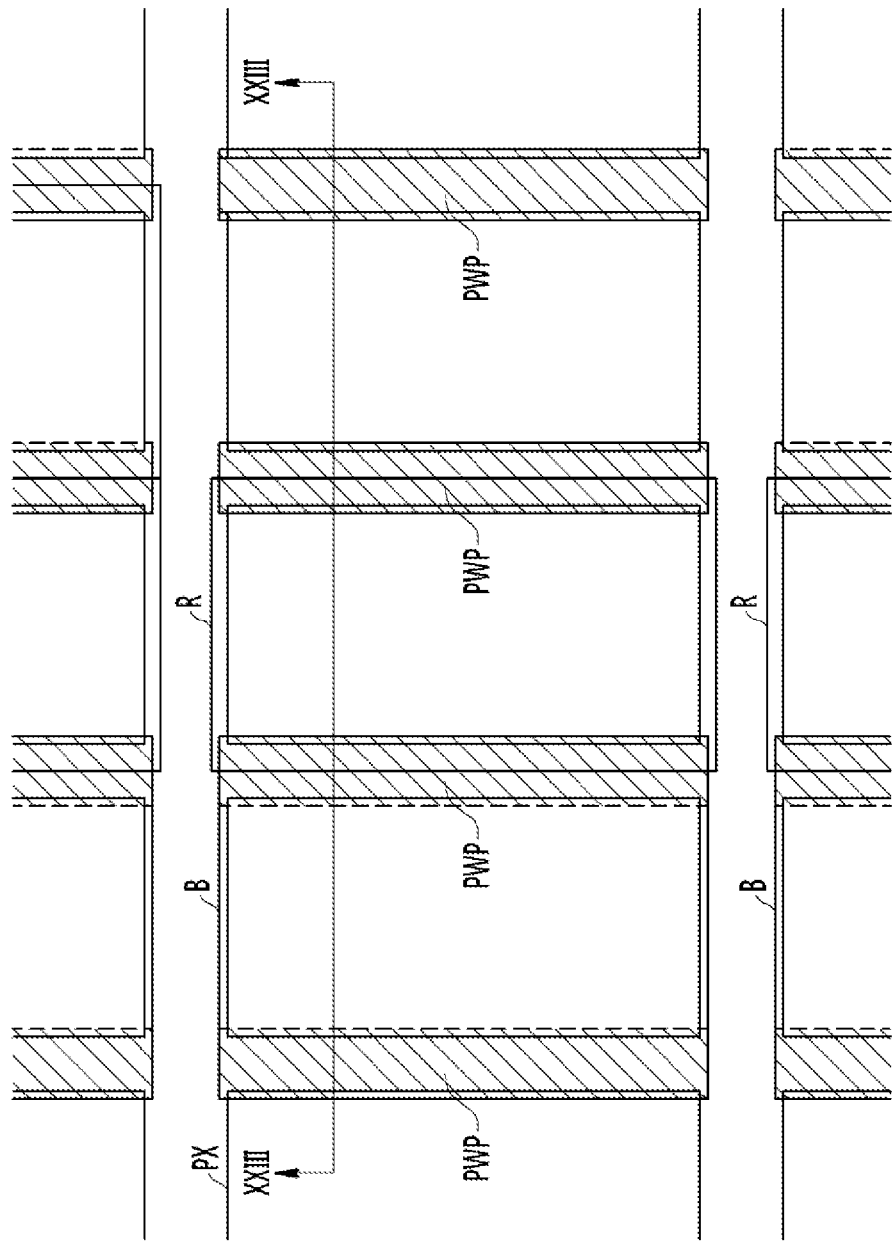
Figure 23:
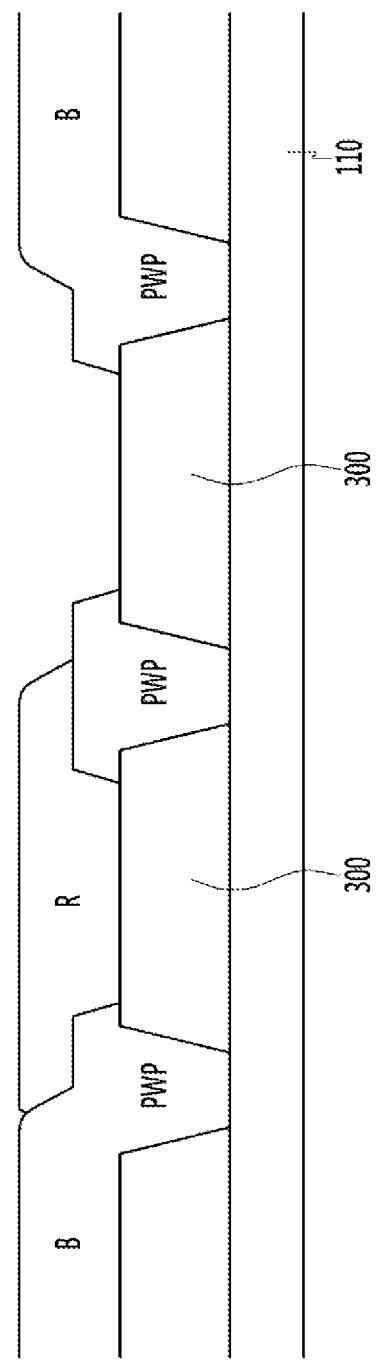
Figure 24:
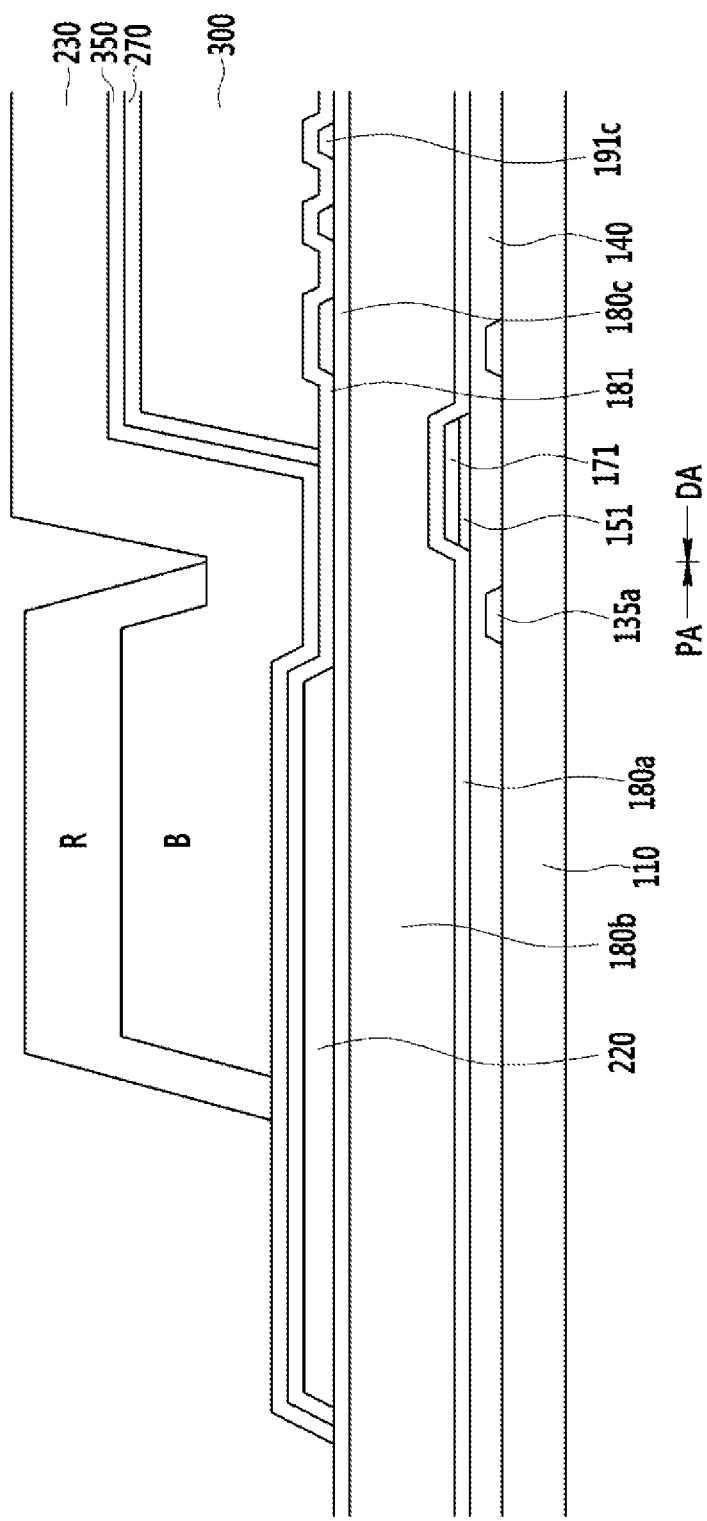
Figure 25:
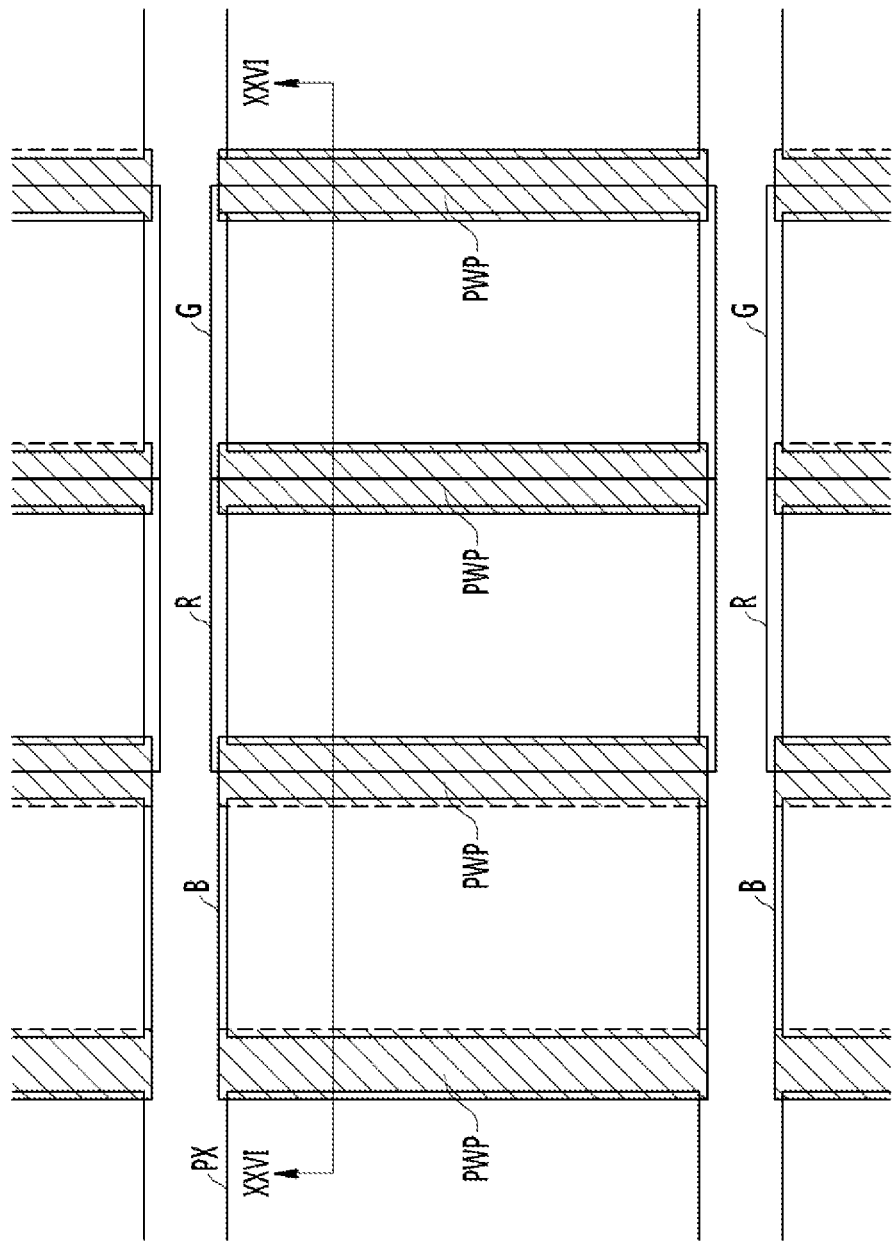
Figure 26:
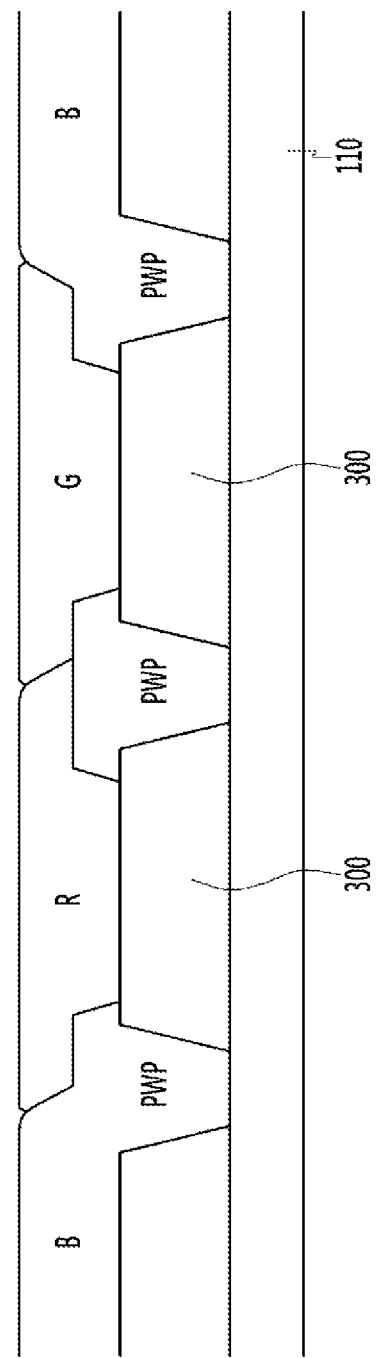
Figure 27:
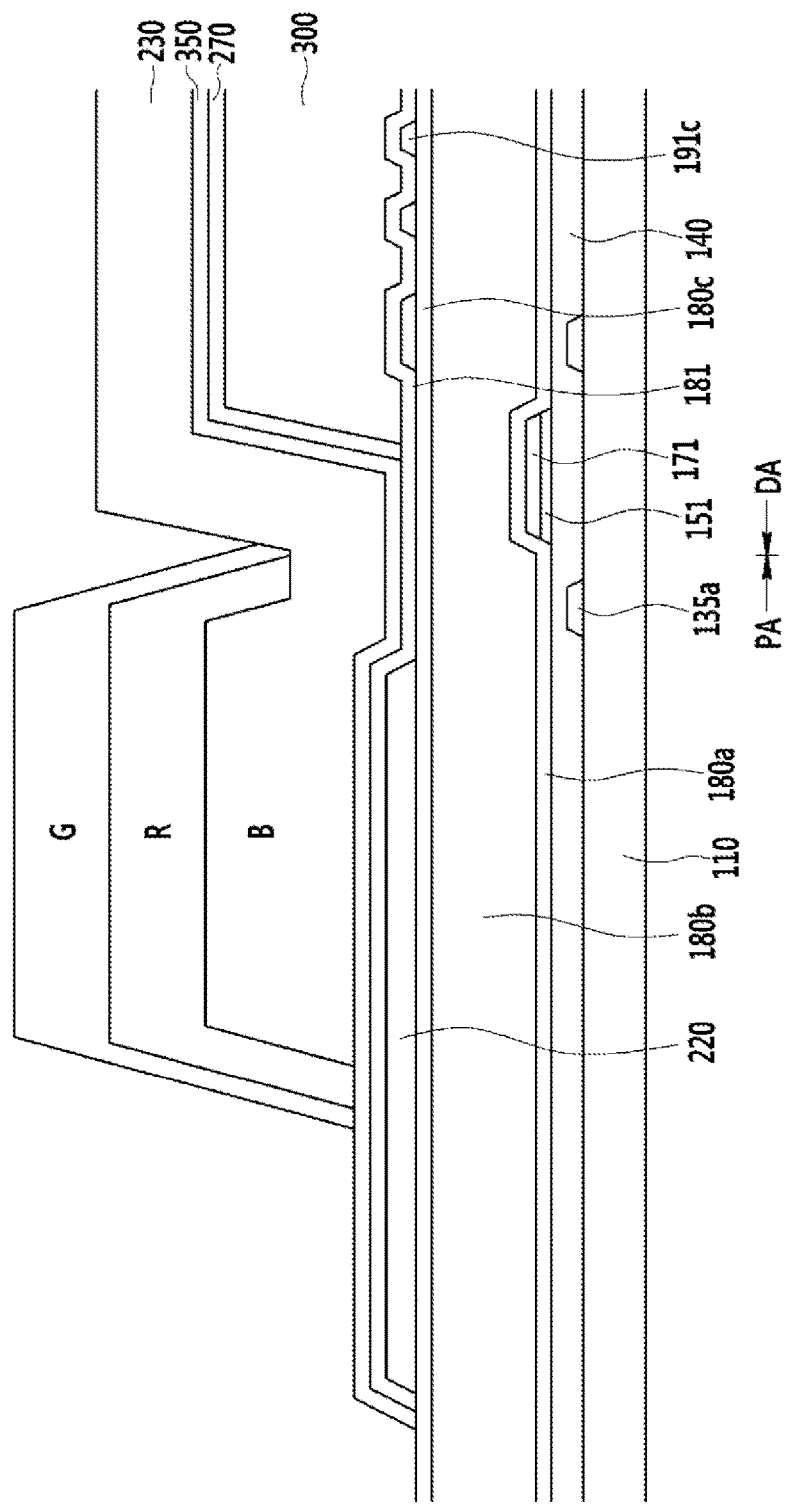

FIG. 11 to FIG. 37 are top plan views and cross-sectional views illustrating a manufacturing method of a liquid crystal display according to an exemplary embodiment. FIGS. 11, 14, 17, 28, 31, 32, and 35 sequentially illustrate the cross-sectional views taken along the line IV-IV of FIG. 3. FIGS. 12, 15, 18, 29, 33, and 36 sequentially illustrate the cross-sectional views taken along the line V-V of FIG. 3. FIG. 19, FIG. 22, and FIG. 25 are top plan views of a color filter and a partition portion in the manufacturing method of the liquid crystal display according to an exemplary embodiment. FIG. 20, FIG. 23, and FIG. 26 are cross-sectional views taken along a line XX-XX of FIG. 19, a line XXIII-XXIII of FIG. 22, and a line XXVI-XXVI of FIG. 25, respectively. FIG. 21, FIG. 24, and FIG. 27 are respectively cross-sectional views illustrating a stacking process of a color filter in a peripheral area.

Figure 11:
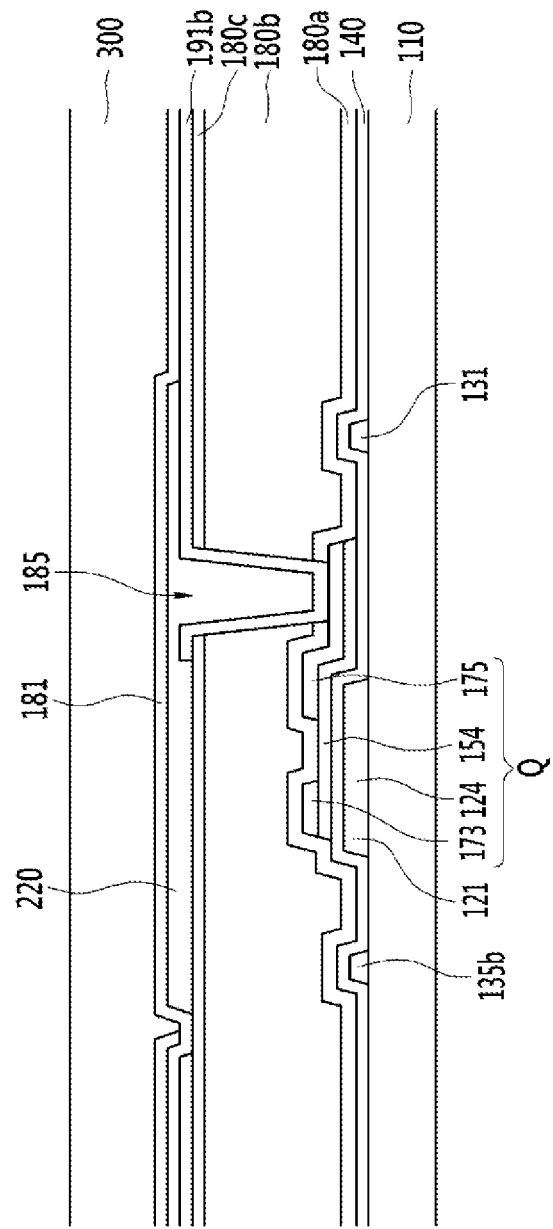
FIGS. 11, 12, 13, 14, 15, 16, 17, 18, 19, 20, 21, 22, 23, 24, 25, 26, 27, 28, 29, 30, 31, 32, 33, 34, 35, 36, and 37 are top plan views and cross-sectional views illustrating a manufacturing method of a liquid crystal display according to an exemplary embodiment.
Figure 12:
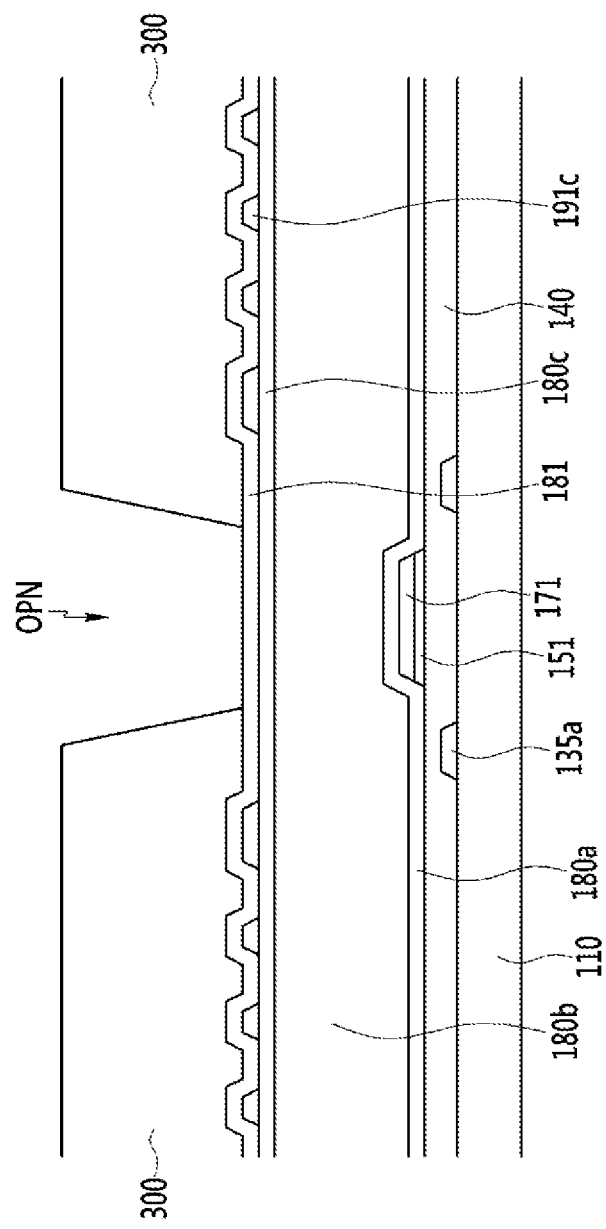

Referring to FIG. 3, FIG. 11, and FIG. 12, to form a generally known switching element on a substrate 110, a gate line 121 extending in a horizontal direction and a gate insulating layer 140 on the gate line 121 are formed, semiconductor layers 151 and 154 are formed on the gate insulating layer 140, and a source electrode 173 and a drain electrode 175 are formed. In this case, the data line 171 connected to the source electrode 173 may be formed to extend in a vertical direction while crossing the gate line 121.

The first interlayer insulating layer 180a is formed on the data conductors 171, 173, and 175 including the source electrode 173, the drain electrode 175, and the data line 171, and the exposed portion of the semiconductor layer 154.

The second interlayer insulating layer 180b and the third interlayer insulating layer 180c are formed on the first interlayer insulating layer 180a, and the contact hole 185 passing through them is formed. Next, the pixel electrode 191 is formed on the third interlayer insulating layer 180c, and the pixel electrode 191 may be electrically and physically connected to the drain electrode 175 through the contact hole 185.

The light blocking member 220 is formed on the pixel electrode 191 or the third interlayer insulating layer 180c. The light blocking member 220 may be formed according to the direction that the gate line 121 extends. The light blocking member 220 may be formed of the material blocking the light. The insulating layer 181 is formed on the light blocking member 220, and the insulating layer 181 may be extended on the pixel electrode 191 while covering the light blocking member 220.

Next, a sacrificial layer 300 is formed on the pixel electrode 191. In this case, an open portion OPN is formed along the direction parallel to the data line 171 in the sacrificial layer 300. In the open portion OPN, the color filter 230 may be filled in a following process thereby forming the partition portion PWP. The sacrificial layer 300 may be formed of a photoresist or the organic material.

Figure 13:
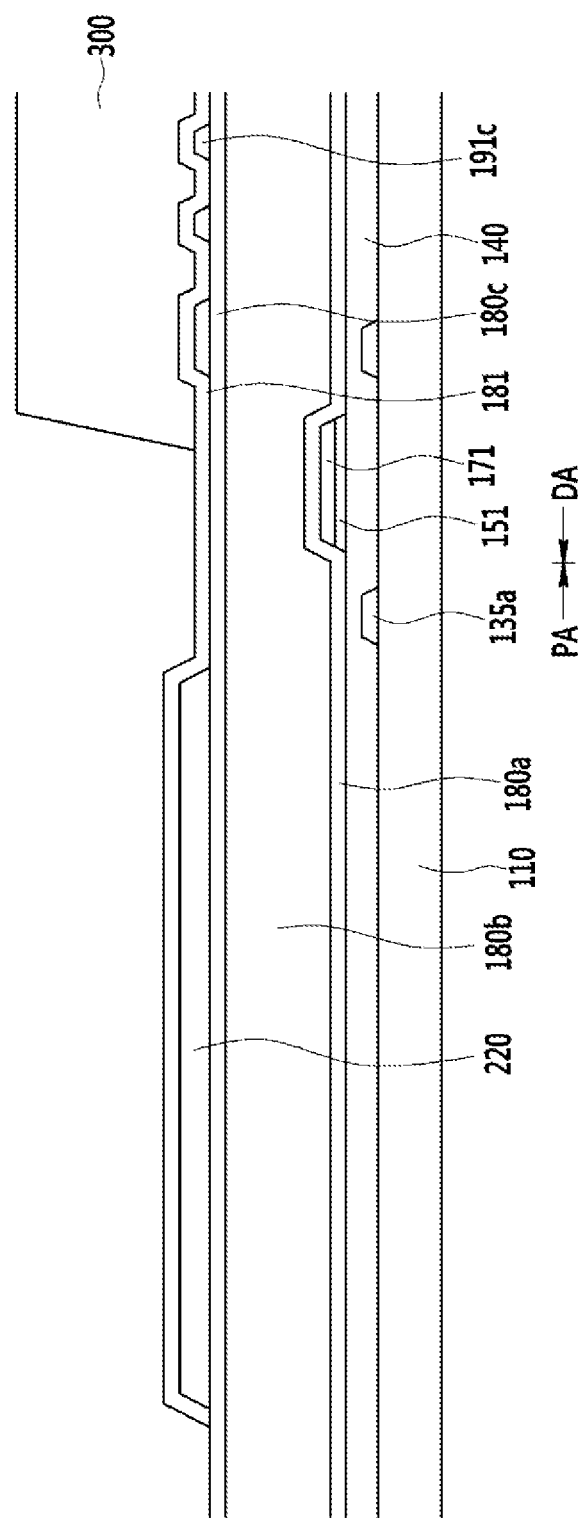

Referring to FIG. 13, in the peripheral area PA, the gate insulating layer 140, the first interlayer insulating layer 180a, the second interlayer insulating layer 180b, the third interlayer insulating layer 180c, the light blocking member 220, and insulating layer 180 may be formed on the substrate 110.

Figure 14:
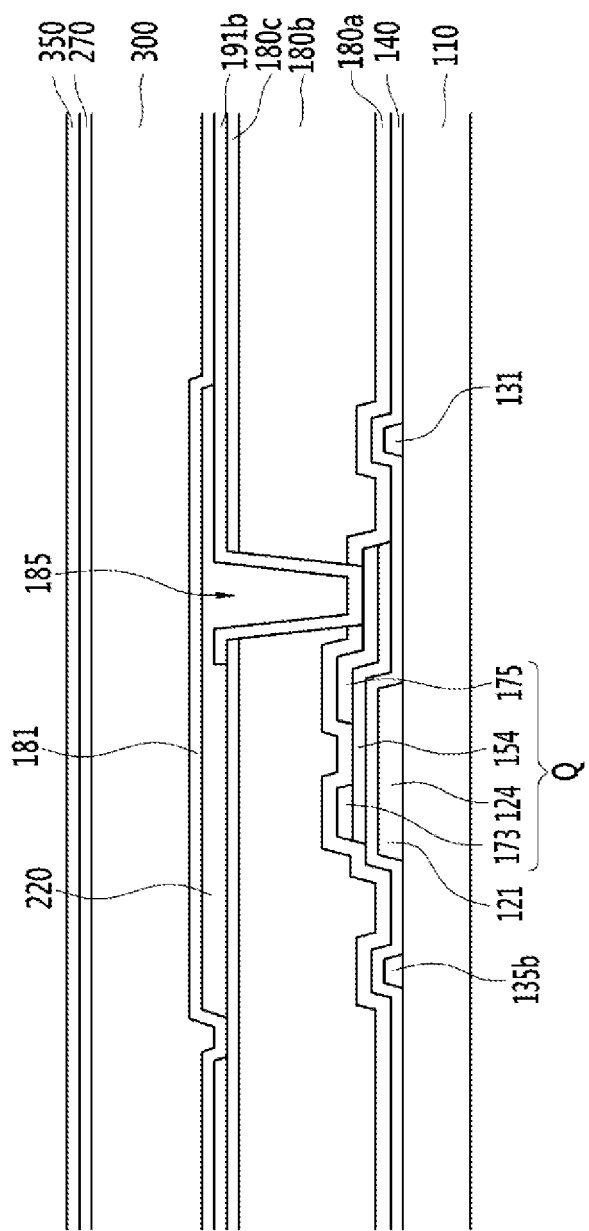
Figure 15:
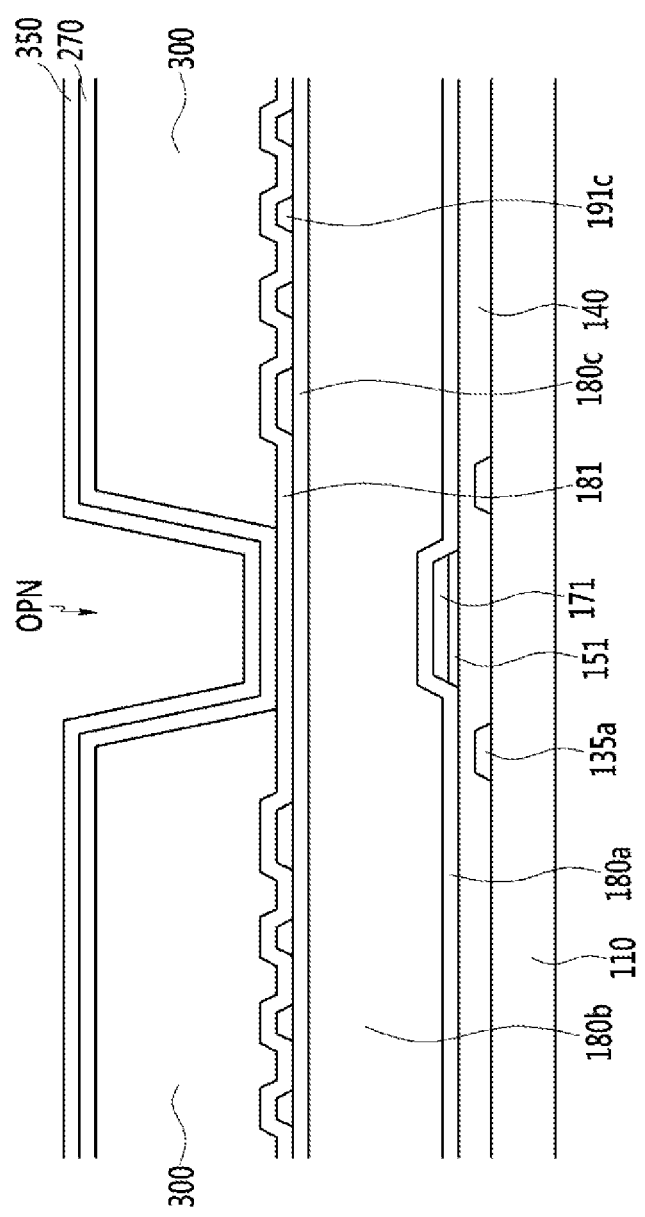
Figure 16:
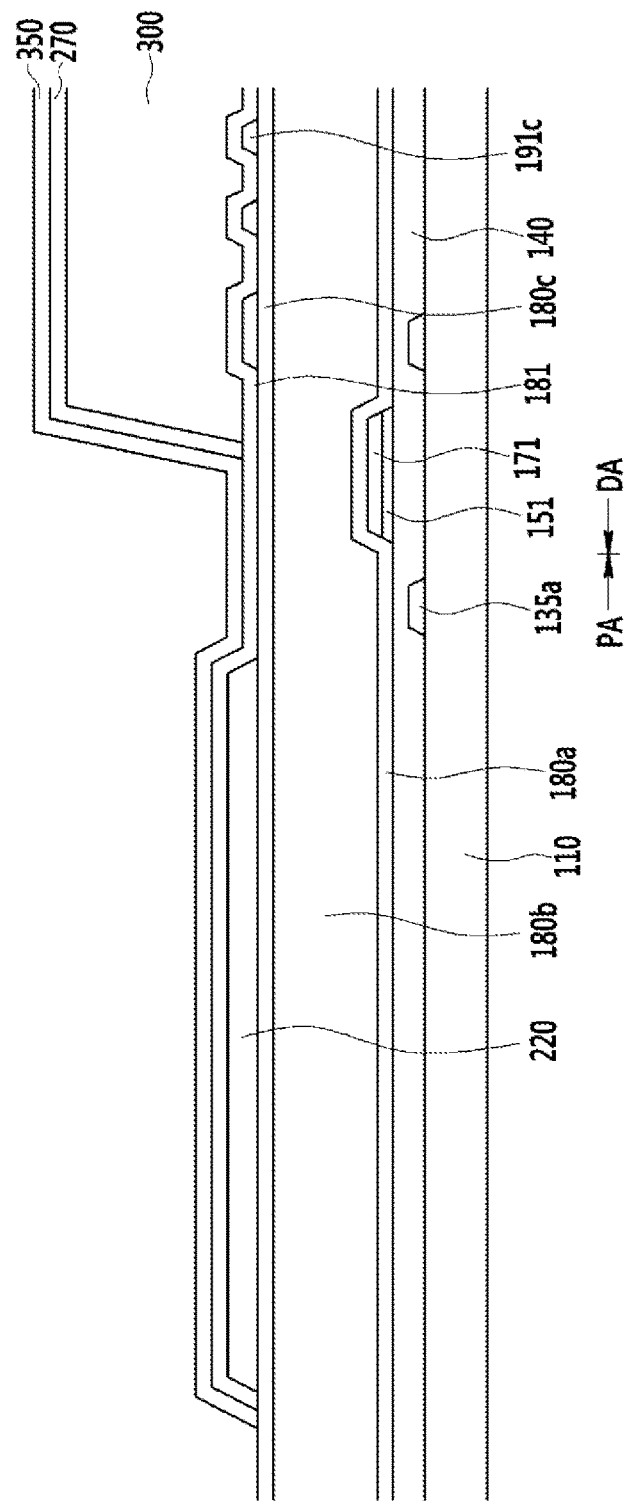

Referring to FIG. 3, FIG. 14, and FIG. 15, the common electrode 270 and the lower insulating layer 350 are sequentially formed on the sacrificial layer 300. As shown in FIG. 15, the common electrode 270 and the lower insulating layer 350 may cover the open portion OPN. Referring to FIG. 16, the lower insulating layer 350 of the display area DA may be formed to extend to the peripheral area PA.

Figure 17:
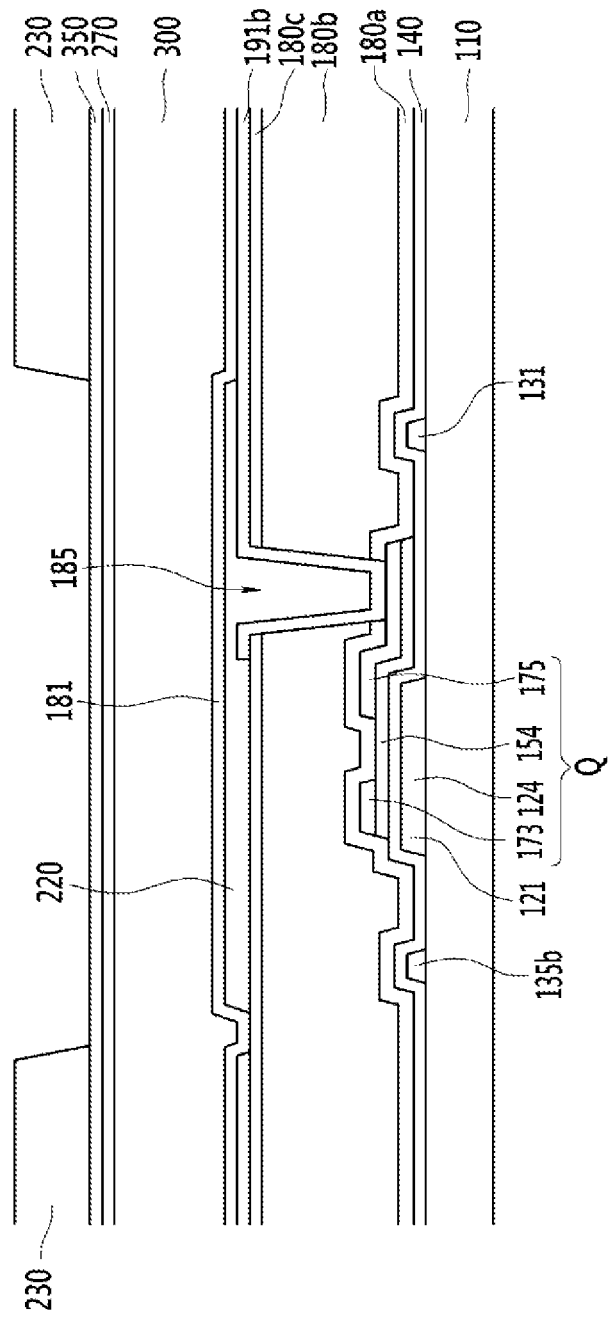
Figure 18:
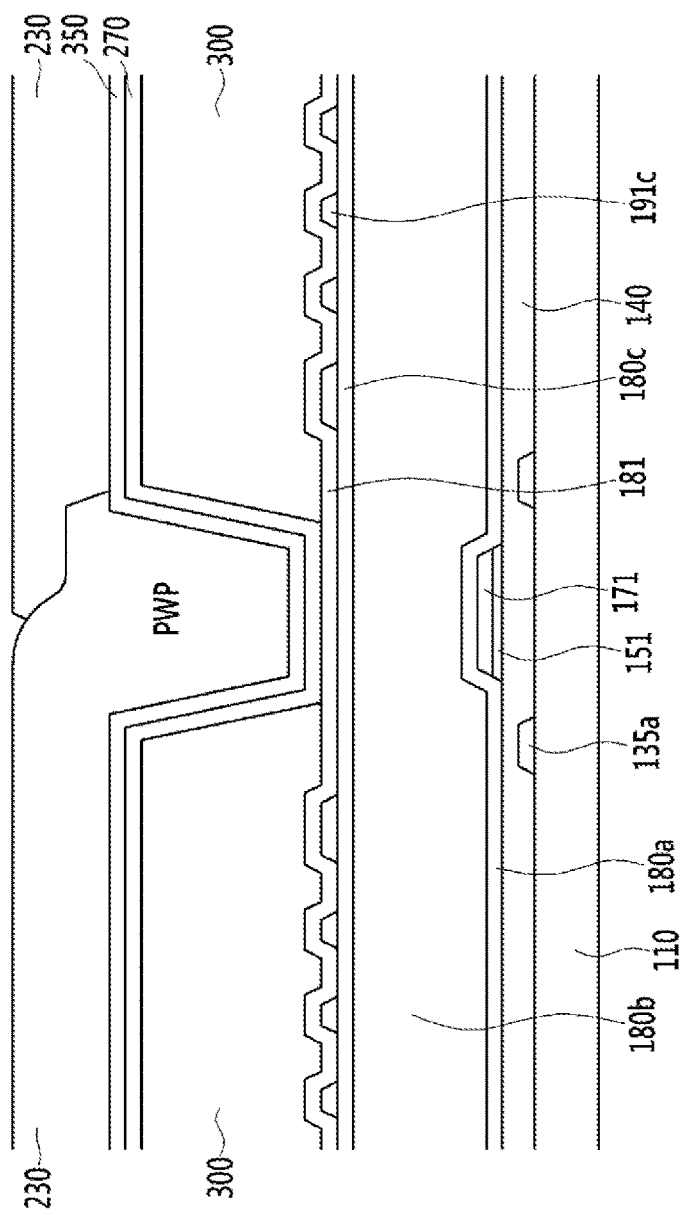

Referring to FIG. 3, FIG. 17, and FIG. 18, the color filter 230 is formed on the lower insulating layer 350. The color filter 230 may be removed in the region corresponding to the light blocking member 220 positioned between the pixel areas adjacent in the vertical direction by the patterning process or the exposure/developing process. As shown in FIG. 17, the color filter 230 exposes the lower insulating layer 350 to the outside in the region corresponding to the light blocking member 220. In this case, as shown in FIG. 18, the color filter 230 forms the partition portion PWP while filling the open portion OPN of the light blocking member 220. In the present exemplary embodiment, the color filter 230 filling the open portion OPN is the color filter 230 of one color. The color filters 230 neighboring the color filter 230 forming the partition portion PWP may overlap each other on the partition portion PWP. However, as the variation of the exemplary embodiment, the neighboring color filters 230 may be formed to be separated from each other on the partition portion PWP.

Hereinafter, the color filter 230 and the blocking film EB according to an exemplary embodiment will be described in detail with reference to FIG. 19 to FIG. 27.

Referring to FIG. 19 and FIG. 20, the blue color filter B is formed on the sacrificial layer 300. In this case, the blue color filter B is formed to fill the separation space between the sacrificial layers 300 separated in the horizontal direction. The blue color filter B is formed at the portion corresponding to the pixel area PX, and the blue color filter B formed corresponding to the pixel area PX extends thereby forming the partition portion PWP. Further, the partition portion PWP is separately formed between two pixel areas PX where the blue color filter B is not formed. For example, the partition portion PWP separated from the partition portion PWP formed by extending the blue color filter B may be formed by using one mask.

In this case, referring to FIG. 21, the blue color filter B may be formed on the peripheral area PA. Herein, the blue color filters B of the display area PA and the peripheral area PA may be formed by employing the same material through the same process, and may be connected to each other.

Referring to FIG. 22 and FIG. 23, the red color filter R is formed on the sacrificial layer 300. The red color filter R is formed to overlap the partition portion PWP, and may overlap on the blue color filter B and the partition portion PWP.

In this case, referring to FIG. 24, in the peripheral area PA, the red color filter R may be formed on the blue color filter B. The red color filter R may be formed to cover a side surface of the blue color filter B.

Referring to FIG. 25 and FIG. 26, the green color filter G is formed on the sacrificial layer 300. The green color filter G is formed to overlap the partition portion PWP, and may respectively overlap the blue color filter B and the red color filter R on the partition portion PWP.

In this case, referring to FIG. 27, in the peripheral area PA, the green color filter G may be formed on the red color filter R. The green color filter G may be formed to cover side surfaces of the blue color filter B and the red color filter R.

The formation position and the sequence of the above-described red color filter R and green color filter G may be changed. Further, differently from that shown in FIG. 26, the thicknesses of the blue color filter B, the red color filter R, and the green color filter G may be different. The reason for differentiating the thicknesses of the blue color filter B, the red color filter R and the green color filter G is to adjust color coordinates in each color filter. Otherwise, the heights of the blue color filter B, the red color filter R, and the green color filter G may be different. To differentiate the height of each color filter, the thickness of the sacrificial layer 300 corresponding to each color filter R, G, and B may be changed. Next, when the sacrificial layer 300 is removed, the microcavities 305 having the different heights may be formed, and the heights of each color filter positioned thereon may be different.

Figure 28:
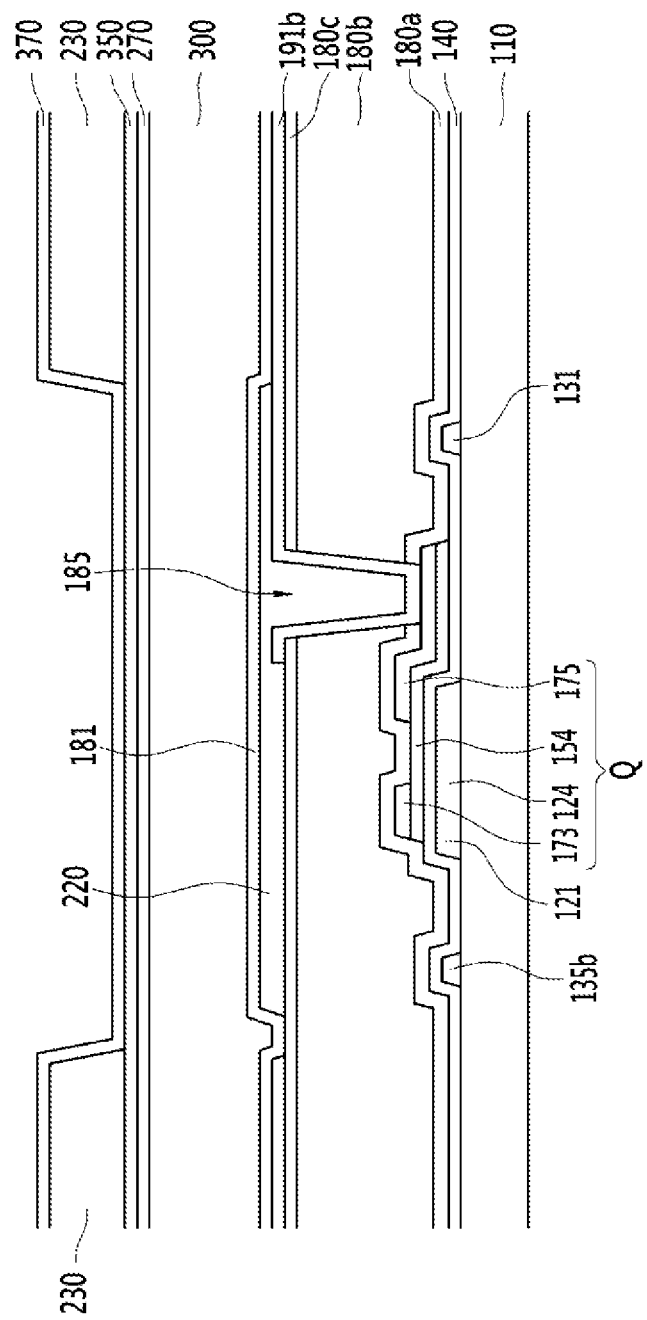
Figure 29:
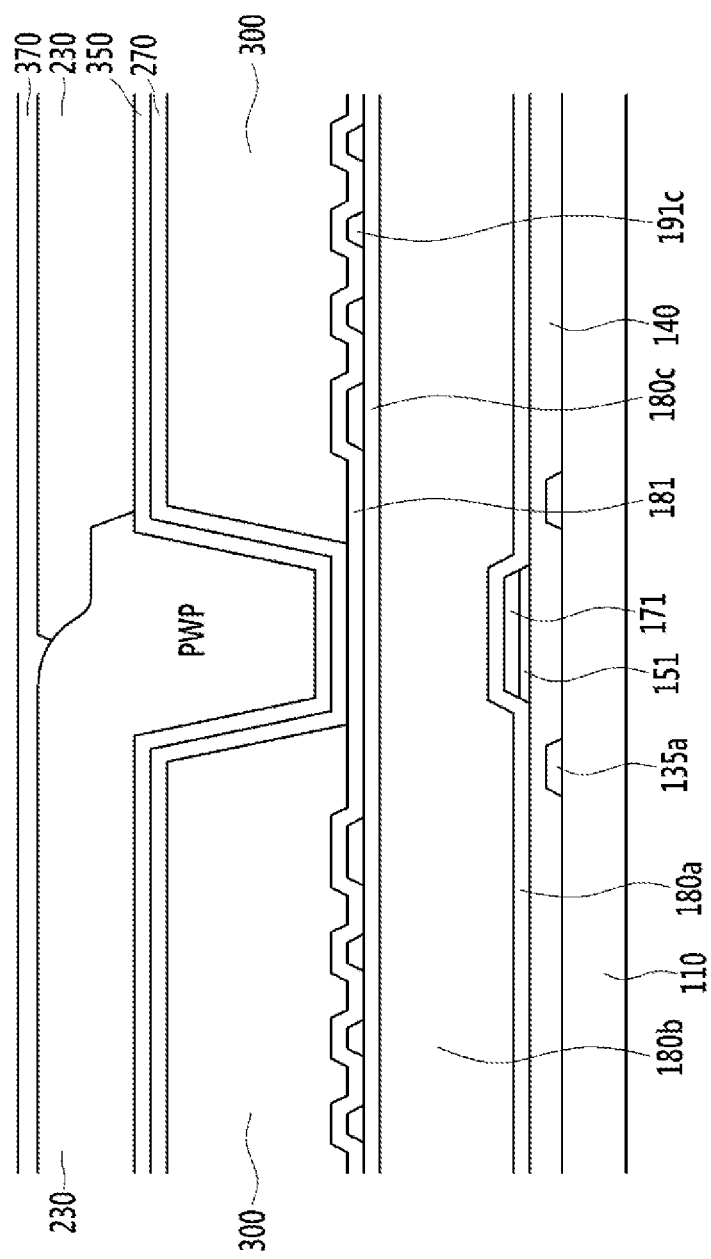

Next, referring to FIG. 3, FIG. 28, and FIG. 29, the upper insulating layer 370 covering the color filter 230 and the exposed lower insulating layer 350 is formed.

Figure 30:
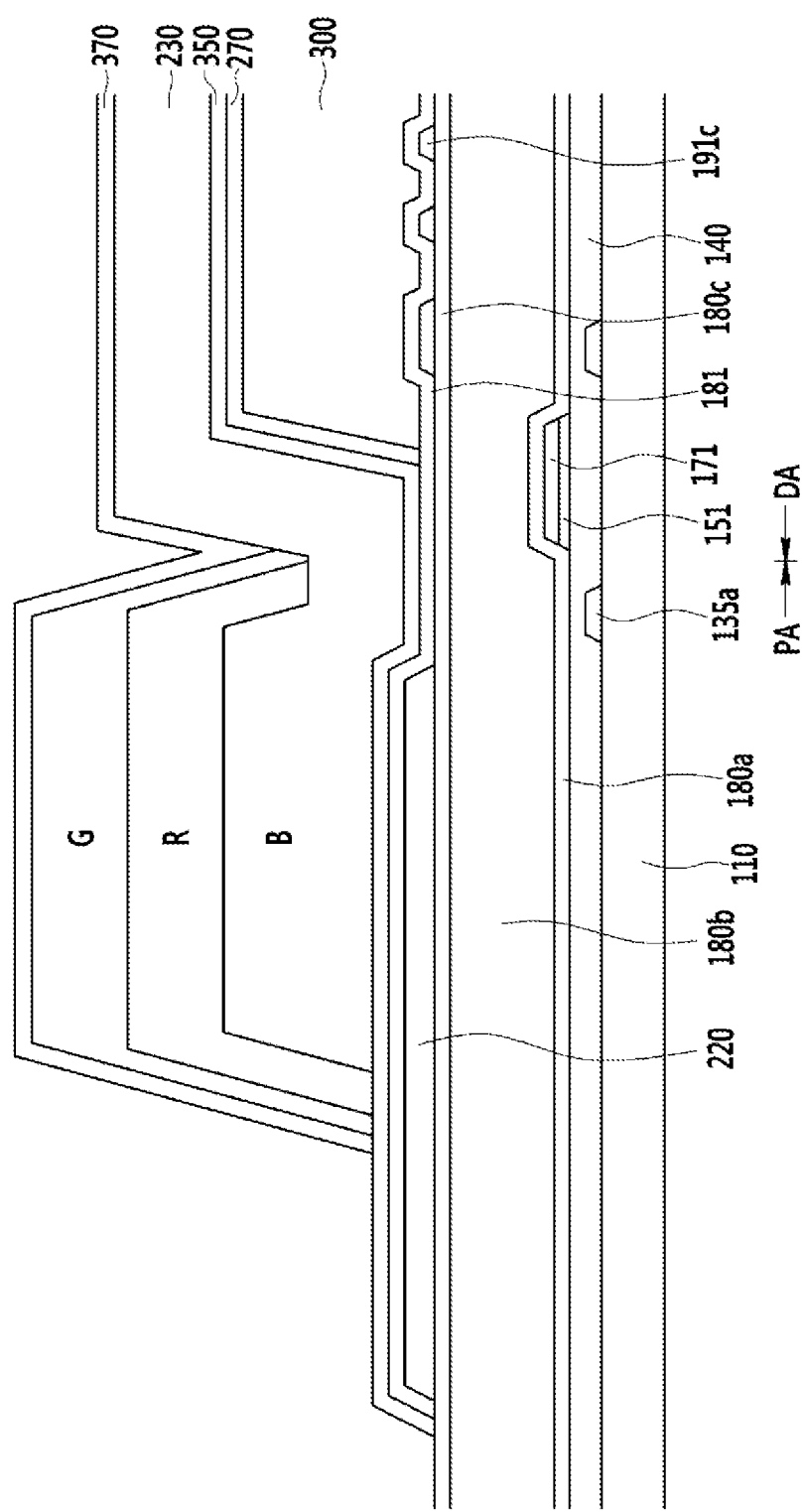

In this case, referring to FIG. 30, the upper insulating layer 370 of the display area DA may be formed to extend to the peripheral area PA. The upper insulating layer 370 may be formed in the peripheral area PA to cover a side surface and a top surface of an organic layer including the blue color filter B, the red color filter R, and the green color filter G.

Figure 31:
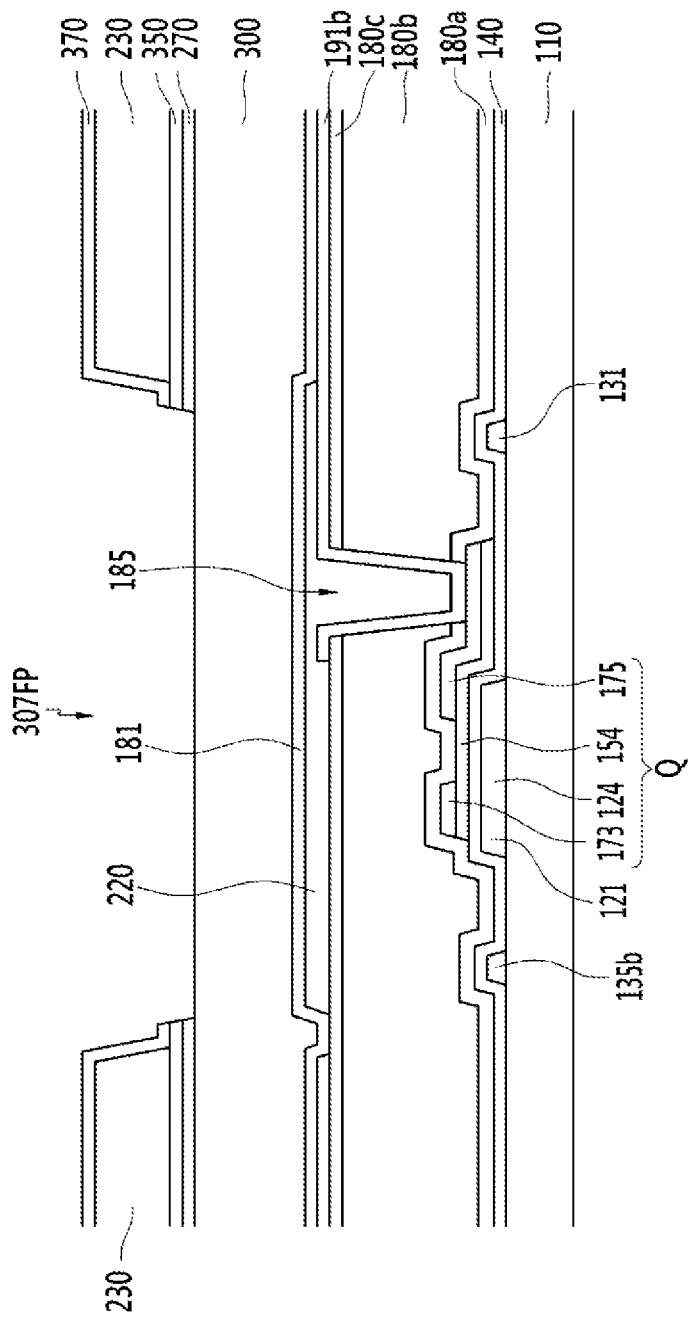

Referring to FIG. 31, the upper insulating layer 370, the lower insulating layer 350, and the common electrode 270 are etched to partially remove the upper insulating layer 370, the lower insulating layer 350, and the common electrode 270, and to form the liquid crystal injection portion 307FP. In this case, the upper insulating layer 370 has a structure covering the side surface of the color filter 230, however it is not limited thereto, and the upper insulating layer 370 covering the side surface of the color filter 230 may be removed to expose the side surface of the color filter 230 to the outside.

Figure 32:
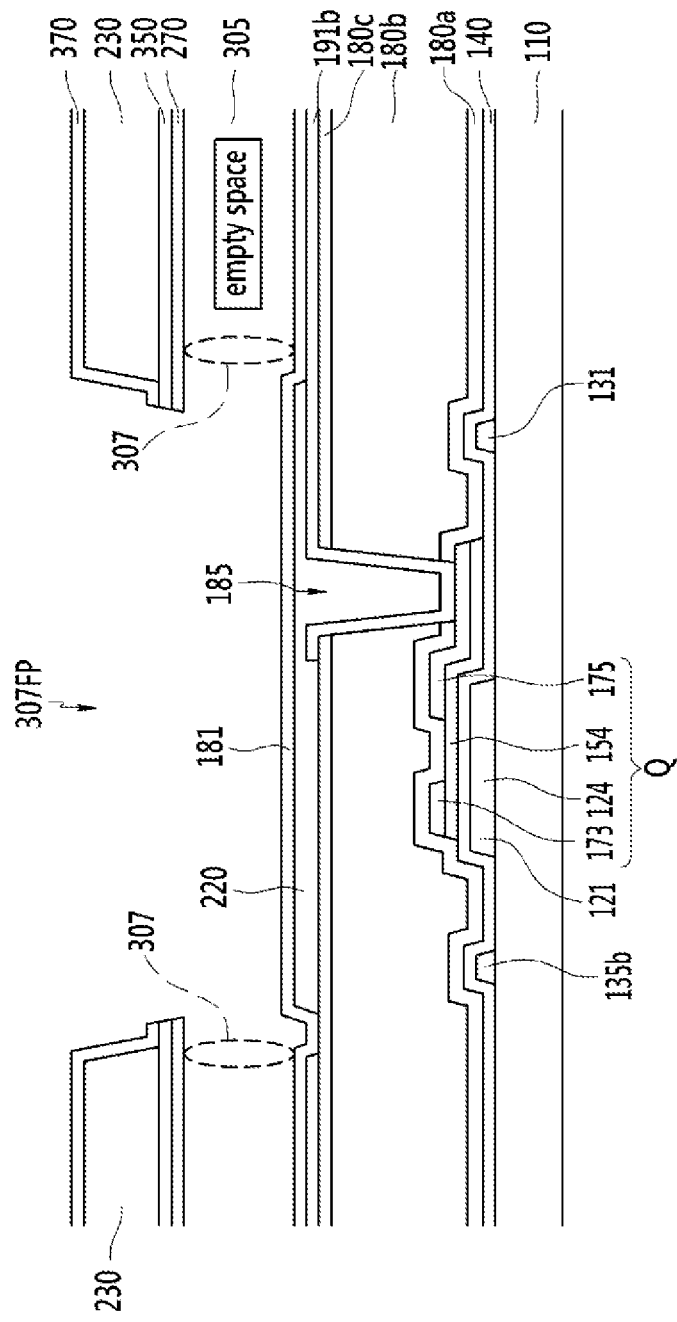
Figure 33:
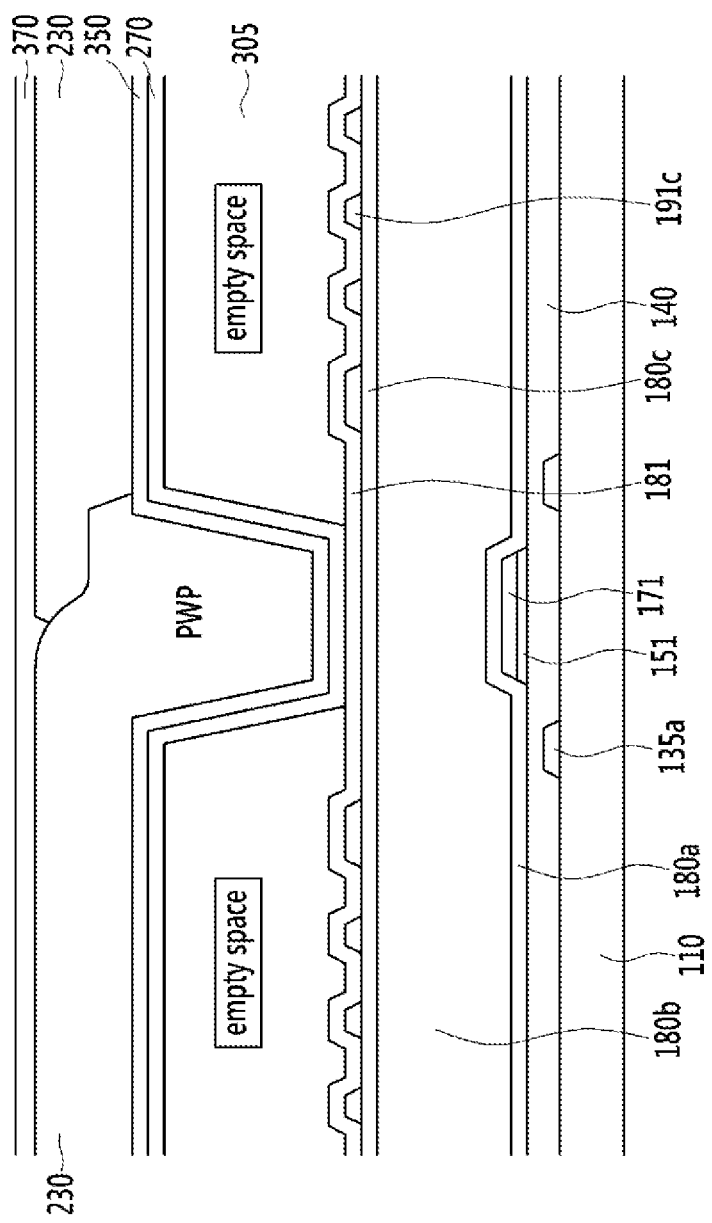
Figure 34:
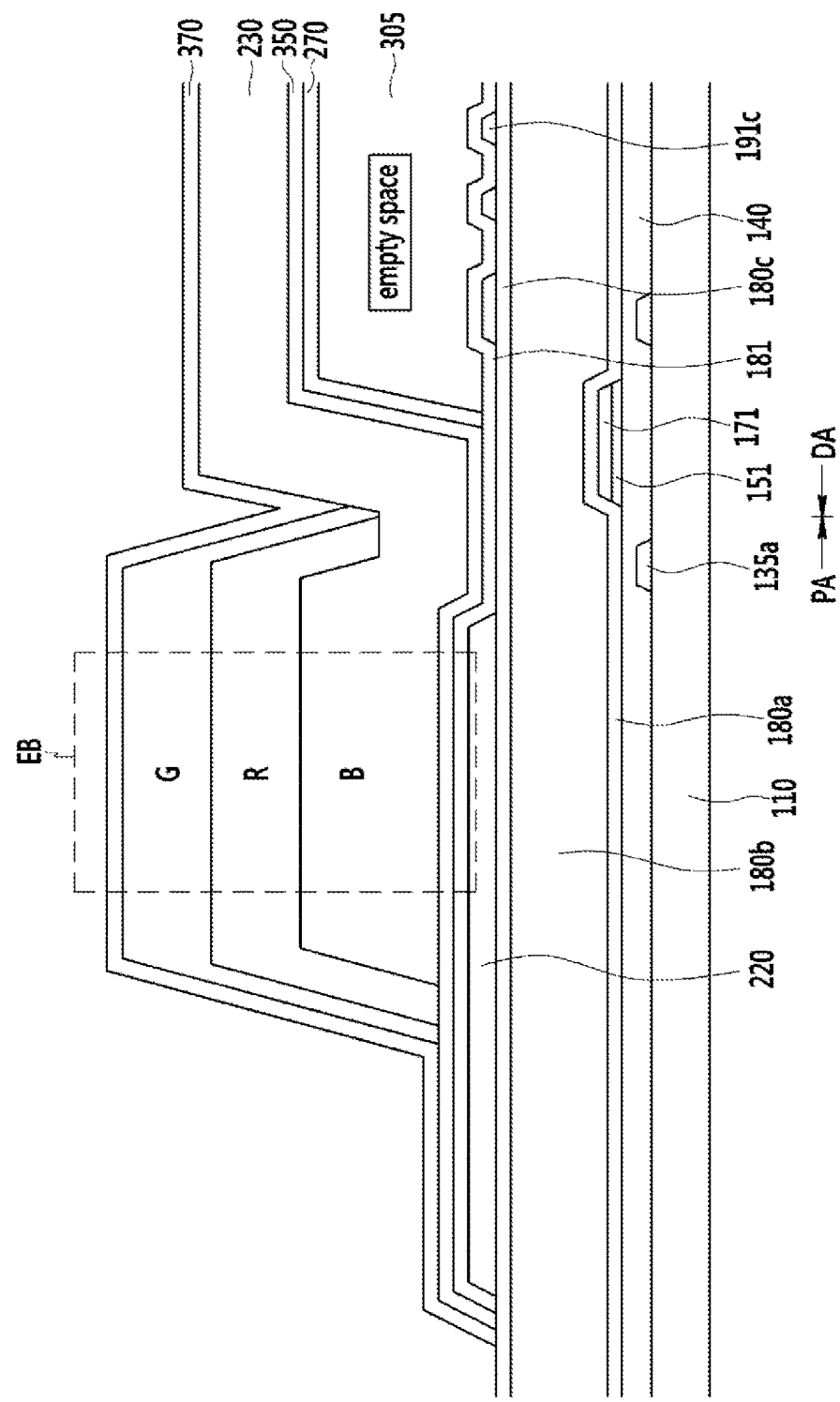

Referring to FIG. 32 to FIG. 34, the sacrificial layer 300 is removed through the liquid crystal injection portion 307FP by oxygen (O₂) ashing treatment or a wet etching method. In this case, the microcavity 305 having the entrance region 307 is formed. The microcavity 305 is an empty space formed when the sacrificial layer 300 is removed.

Figure 35:
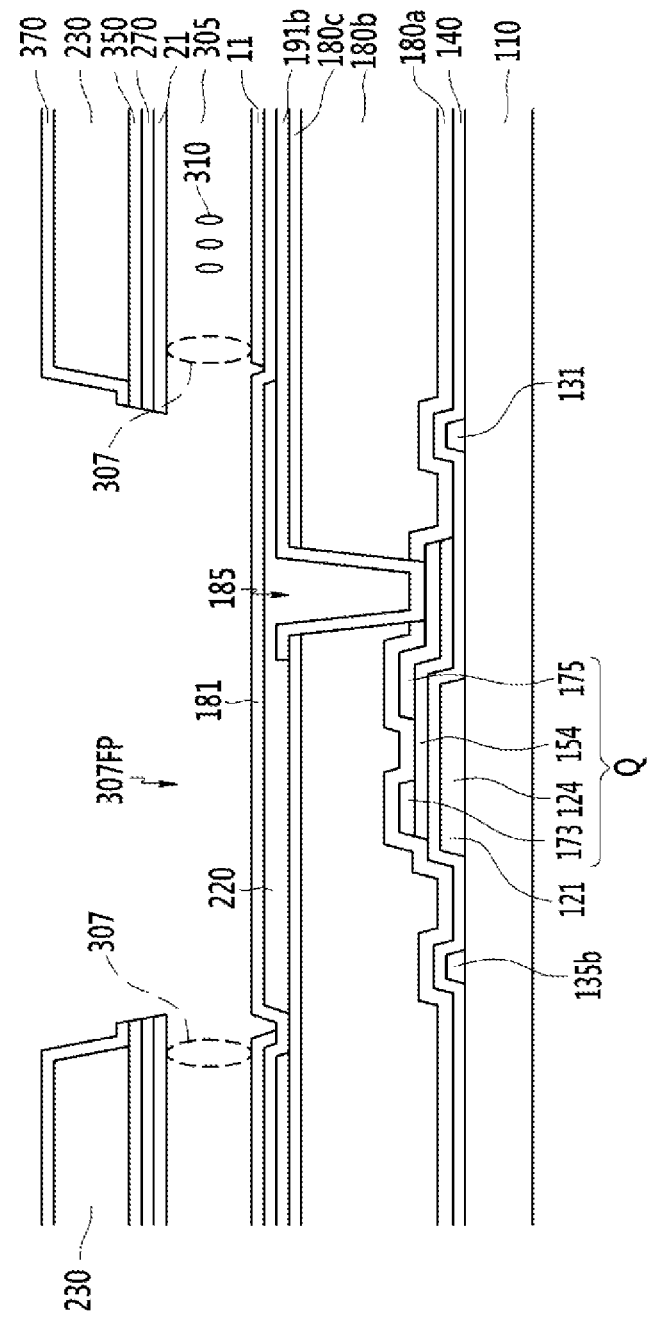
Figure 36:
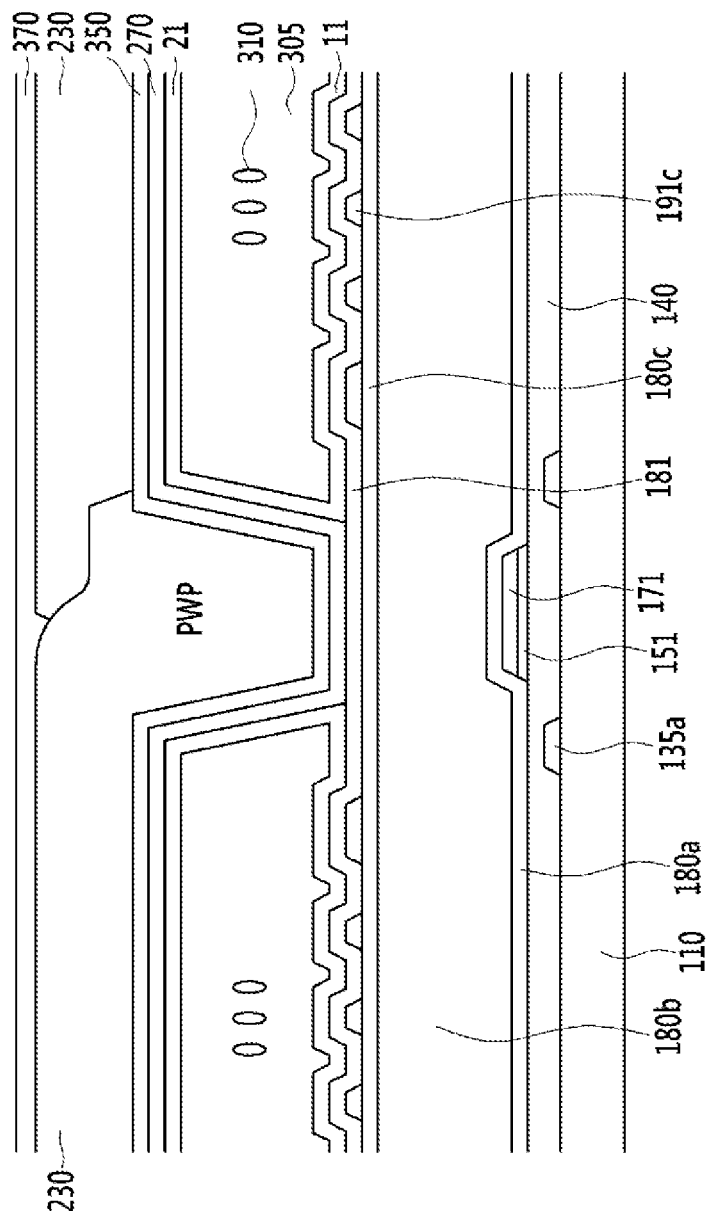
Figure 37:
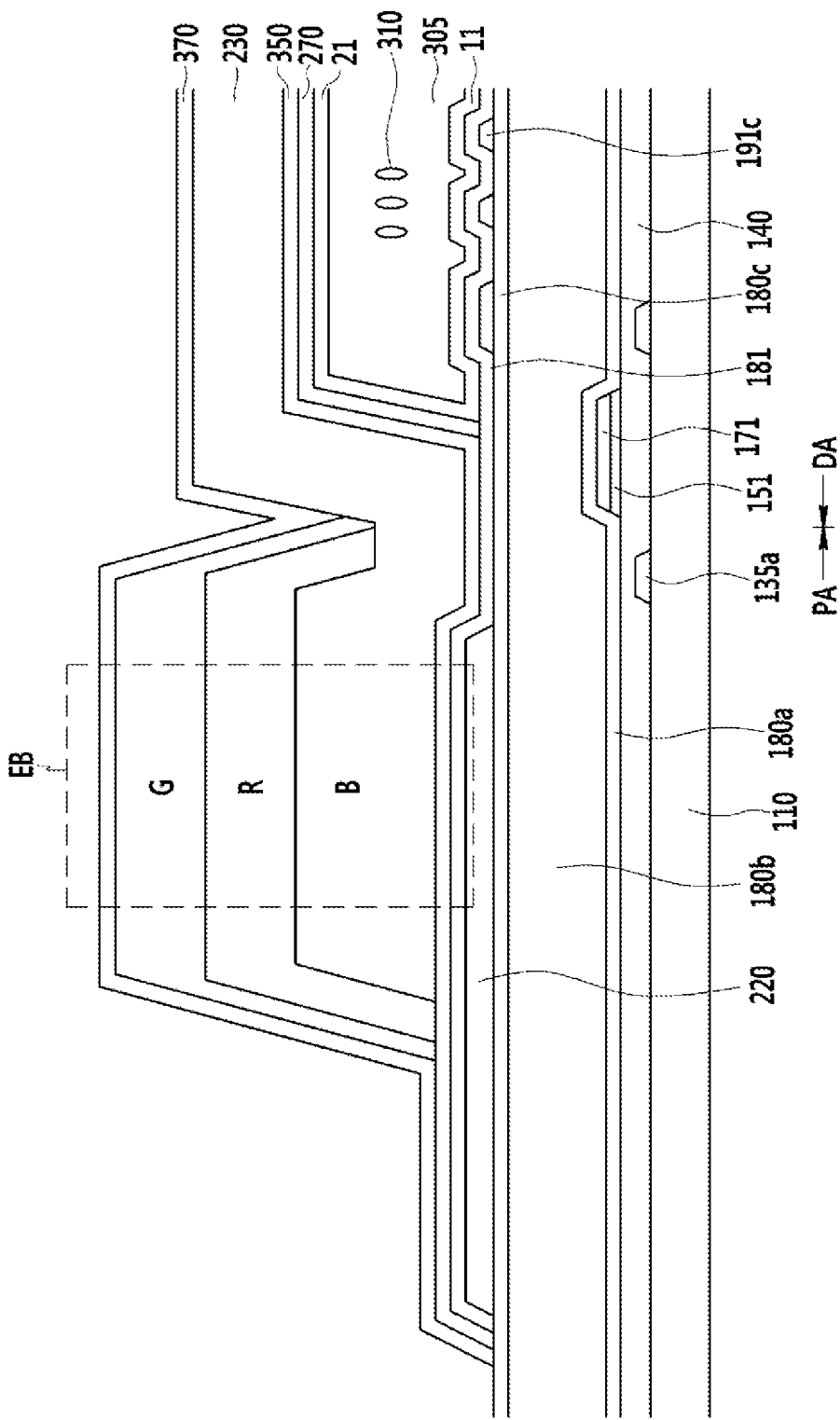

Referring to FIG. 35 to FIG. 37, the alignment material is injected through the entrance region 307 to form the alignment layers 11 and 21 on the pixel electrode 191 and the common electrode 270. In detail, a bake process is performed after injecting an alignment material including a solid content and a solvent through the entrance region 307.

Next, a liquid crystal material including the liquid crystal molecules 310 is injected into the microcavity 305 via the entrance region 307, using an inkjet method and the like.

Thereafter, the capping layer 390 is formed on the upper insulating layer 370 to cover the entrance region 307 and the liquid crystal injection portion 307FP to form the liquid crystal display illustrated in FIG. 2, FIG. 4, and FIG. 5.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

<Description of Symbols>

| | | | |
|---|---|---|---|
| 300 | sacrificial layer | 305 | microcavity |
| 307 | entrance region | 350 | lower insulating layer |
| 370 | upper insulating layer | 390 | capping layer |

What is claimed is:

1. A liquid crystal display comprising:
   a substrate configured to include a display area and a peripheral area;
   a thin film transistor disposed on the substrate;
   a pixel electrode connected to the thin film transistor;
   a roof layer disposed to face the pixel electrode;
   a capping layer disposed on the roof layer such that the roof layer is between the capping layer and the pixel electrode, the capping layer comprising a top surface and a lateral surface extending from the top surface towards the substrate;
   a blocking film disposed in the peripheral area to surround the lateral surface of the capping layer; and
   a liquid crystal layer in a plurality of microcavities formed between the pixel electrode and the roof layer in the display area, the capping layer including portions that are positioned at entrance regions of the plurality of microcavities and directly contact the liquid crystal layer,
   wherein a level of a top surface of the blocking film is higher than that of a top surface of the liquid crystal layer.

2. The liquid crystal display of claim 1, further comprising, in the display area:
   a lower insulating layer disposed below the roof layer; and
   an upper insulating layer disposed on the roof layer,
   wherein the lower insulating layer and the upper insulating layer are made of an inorganic film, and
   the blocking film includes an organic and inorganic structure layer disposed to correspond to the lower insulating layer, the roof layer, and the upper insulating layer.

3. The liquid crystal display of claim 2, wherein the organic and inorganic structure layer includes a first inorganic layer, an organic layer, and a second inorganic layer,
   wherein the first inorganic layer is disposed to correspond to the lower insulating layer, the second inorganic layer is disposed to correspond to the upper insulating layer, and the organic layer includes at least one color filter.

4. The liquid crystal display of claim 3, wherein the first inorganic layer is connected to the lower insulating layer, and the second inorganic layer is connected to the upper insulating layer.

5. The liquid crystal display of claim 4, wherein the organic layer has a structure at which color filters having different colors are stacked.

6. The liquid crystal display of claim 5, wherein the roof layer includes a color filter.

7. The liquid crystal display of claim 6, wherein the microcavities are partitioned by a partition portion, and
   the partition portion is formed by a color filter having a single color among the color filters.

8. The liquid crystal display of claim 7, wherein the partition portion is a part formed by filling a space between adjacent microcavities with the color filter having the single color.

9. The liquid crystal display of claim 8, wherein the partition portion is formed along a direction in which a data line connected to the thin film transistor is extended.

10. The liquid crystal display of claim 3, wherein the second inorganic layer is disposed to cover a top surface and a lateral surface of the organic layer.

11. The liquid crystal display of claim 1, further comprising:
    a barrier layer disposed on the top surface of the capping layer,
    wherein the barrier layer includes silicon nitride.

12. The liquid crystal display of claim 1, wherein the top surfaces of the capping layer and the blocking film are disposed at a same level.

13. The liquid crystal display of claim 1, further comprising:
    a lower insulating layer disposed below the roof layer; and
    an upper insulating layer disposed on the roof layer,
    wherein the lower insulating layer and the upper insulating layer are made of an inorganic film,
    the blocking film is an organic and inorganic structure layer including the lower insulating layer extended from the display area, an organic layer, and the upper insulating layer extended from the display area, and
    the organic layer has a structure at which color filters having different colors are stacked, and one of the color filters is connected to the roof layer.

14. The liquid crystal display of claim 13, further comprising:
    a transparent electrode pattern disposed below the organic and inorganic structure layer.

15. The liquid crystal display of claim 14, further comprising:
a sacrificial layer remaining pattern disposed below the organic and inorganic structure layer.

16. The liquid crystal display of claim 1, wherein the blocking film and the roof layer disposed in the display area are separated from each other.

* * * * *